United States Patent
Hui et al.

(10) Patent No.: US 10,602,275 B2
(45) Date of Patent: Mar. 24, 2020

(54) AUDIO ENHANCEMENT VIA BEAMFORMING AND MULTICHANNEL FILTERING OF AN INPUT AUDIO SIGNAL

(71) Applicant: BITwave Pte Ltd, Singapore (SG)

(72) Inventors: Siew Kok Hui, Singapore (SG); Lei Tu, Singapore (SG)

(73) Assignee: BITWAVE PTE LTD, Singapore (SG)

( * ) Notice: Subject to any disclaimer, the term of this patent is extended or adjusted under 35 U.S.C. 154(b) by 94 days.

(21) Appl. No.: 14/968,846

(22) Filed: Dec. 14, 2015

(65) Prior Publication Data

US 2016/0173047 A1 Jun. 16, 2016

Related U.S. Application Data

(60) Provisional application No. 62/092,790, filed on Dec. 16, 2014.

(51) Int. Cl.
*H04R 5/04* (2006.01)
*H04R 25/00* (2006.01)
(Continued)

(52) U.S. Cl.
CPC ............ *H04R 5/04* (2013.01); *G10L 21/0208* (2013.01); *H03G 5/165* (2013.01); *H03G 7/002* (2013.01);
(Continued)

(58) Field of Classification Search
CPC ...... H04R 5/04; H04R 25/405; H04R 25/505; H04R 2201/40; H04R 2430/01; H04R 25/50; H04R 25/407; H04R 25/552; H04S 2400/13; H04S 7/307; G10L 21/0208; G10L 2021/02166; H03G 5/165; H03G 7/002; H03G 7/007
See application file for complete search history.

(56) References Cited

U.S. PATENT DOCUMENTS 4,641,361 A * 2/1987 Rosback ................ H03G 9/025
330/278
8,031,891 B2 * 10/2011 Ball ....................... H04H 60/45
381/303

(Continued)

*Primary Examiner* — Jason R Kurr
(74) *Attorney, Agent, or Firm* — Amin, Turocy & Watson, LLP

(57) ABSTRACT

Enhancing audio content based on application of different gains to different frequency bands of an audio signal is disclosed. Audio information contained in an input signal can undergo beamforming to provide an initial adjustment to the audio information, e.g., noise reduction, etc. In an embodiment beamforming can comprise double-beamforming in which first audio information is adjusted based on second audio information and the second audio information is adjusted based on the first audio information. Different gains can be applied to content in determined frequency bands, resulting in an amplified signal. In some embodiments, the gains can be related to hearing sensitivity of a listener, e.g., via a hearing sensitivity model. The amplified audio information from each frequency band can then be recombined. The recombined signal can be level limited and subjected to further digital and analog gains. The resulting output, e.g., enhanced audio, can be individually adapted for a listener.

20 Claims, 9 Drawing Sheets

(51) Int. Cl.
*G10L 21/0208* (2013.01)
*H03G 5/16* (2006.01)
*H03G 7/00* (2006.01)
*G10L 21/0216* (2013.01)

(52) U.S. Cl.
CPC .......... *H03G 7/007* (2013.01); *H04R 25/405* (2013.01); *H04R 25/505* (2013.01); *G10L 2021/02166* (2013.01); *H04R 2201/40* (2013.01); *H04R 2430/01* (2013.01); *H04S 2400/13* (2013.01)

(56) References Cited

U.S. PATENT DOCUMENTS

| | | | | |
|---|---|---|---|---|
| 9,532,156 B2* | 12/2016 | Wu | .......................... | H04R 3/12 |
| 2005/0069162 A1* | 3/2005 | Haykin | ................ | H04R 25/407 |
| | | | | 381/312 |
| 2007/0274527 A1* | 11/2007 | Abel | ..................... | H04S 1/002 |
| | | | | 381/1 |
| 2009/0103742 A1* | 4/2009 | Ribic | .................... | H04R 25/35 |
| | | | | 381/60 |
| 2014/0010373 A1* | 1/2014 | Gran | ..................... | H04R 25/50 |
| | | | | 381/23.1 |
| 2014/0254842 A1* | 9/2014 | Smith | ................... | H04R 25/50 |
| | | | | 381/317 |
| 2016/0119714 A1* | 4/2016 | Madsen | ................ | H04R 3/007 |
| | | | | 381/55 |

\* cited by examiner

AUDIO ENHANCEMENT VIA BEAMFORMING AND MULTICHANNEL FILTERING OF AN INPUT AUDIO SIGNAL

CROSS REFERENCE TO RELATED APPLICATION

The subject patent application claims priority to U.S. Provisional Patent Appln. No. 62/092,790, filed Dec. 16, 2014, and entitled "Intelligent Hearing Enhancement System Using Filter Bank." The entirety of the aforementioned application is hereby incorporated by reference herein.

TECHNICAL FIELD

The disclosed subject matter relates to audio signal enhancement technology, e.g., modification of an input audio signal, for example, by beamforming, frequency band filtering, selective application of gain to a frequency band, etc., to improve a signal-to-noise ratio (SNR) at an output audio signal.

BACKGROUND

By way of brief background, hearing sensitivity loss can result from natural causes, such as ageing, congenital defects, etc. However, in the modern world, hearing sensitivity loss can be the result of environmental conditions. Individuals can suffer from hearing loss, often with exaggerated loss of sensitivity to particular frequencies of sound. As an example, an individual can experience hearing sensitivity loss due to prolonged exposure to loud sounds, such as from headphones/earphones, work environments, etc. There is general concern that, due to advent of portable audio devices, such as MP3 players, etc., that many people will suffer from hearing sensitivity loss due to prolonged exposure to music played at volumes that can damage the physiological structures associated with hearing, e.g., they tend to listen to the music at too high a volume while listening through headsets, especially in noisy environments, which can lead to hearing loss in one or more audio frequencies, which can lead to a user playing music at an even higher volume to compensate, and so on.

Conventionally, measuring hearing sensitivity can be achieved through a headphone or headset with an embedded acoustic sensor operated by trained professional or hearing specialist, etc. Conventional techniques can be expensive, can require travel to a doctor's office, can be subject to scheduling of an office visit, etc., which can lead to people being less likely to seek a hearing sensitivity loss evaluation. Of note, an individual that seeks an evaluation of hearing sensitivity loss, despite the impediments of conventional techniques, can already be experiencing a level of hearing sensitivity loss of sufficient magnitude to spur that person into action. Where hearing sensitivity loss can be avoided, reduced, or evaluated earlier and with fewer impediments than conventional techniques/technology, more severe hearing sensitivity loss can be reduced, mitigated, or avoided. Further, where hearing sensitivity loss is suspected or detected earlier, treatment plans can also be implemented earlier.

DETAILED DESCRIPTION

Figure 1:
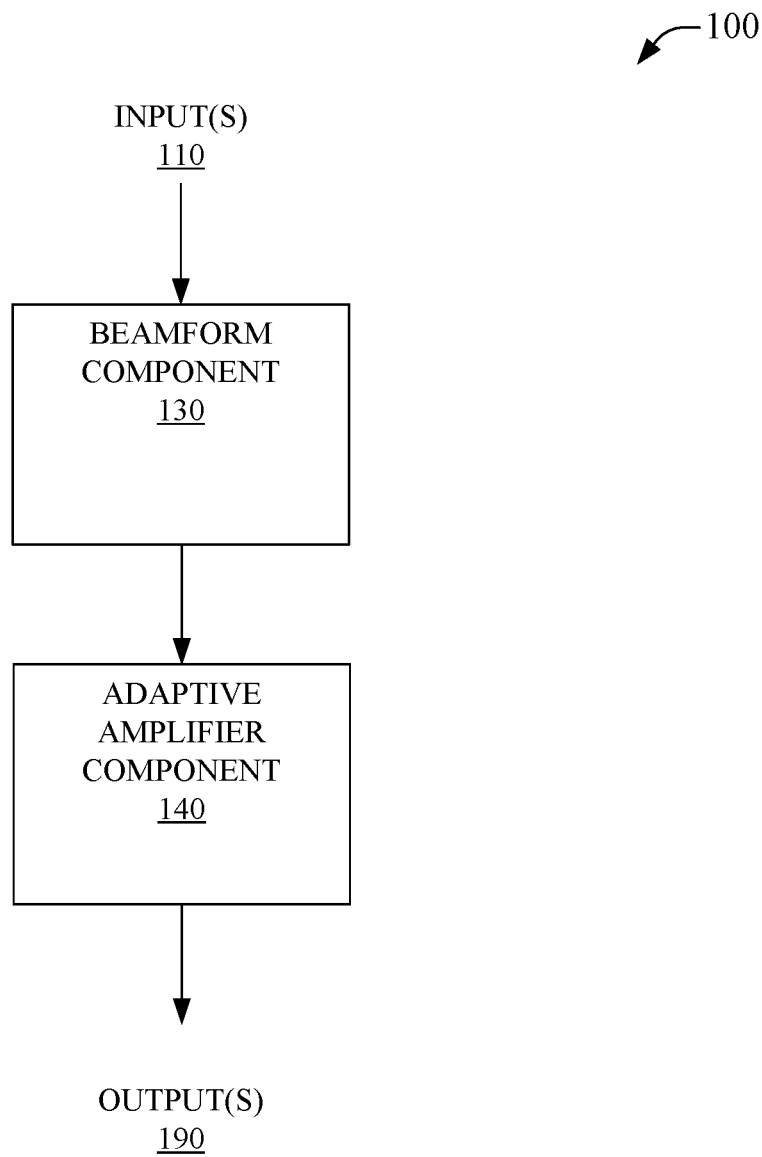
FIG. 1 is an illustration of an example system that facilitates audio enhancement in accordance with aspects of the subject disclosure.

The subject disclosure is now described with reference to the drawings, wherein like reference numerals are used to refer to like elements throughout. In the following description, for purposes of explanation, numerous specific details are set forth in order to provide a thorough understanding of the subject disclosure. It may be evident, however, that the subject disclosure may be practiced without these specific details. In other instances, well-known structures and devices are shown in block diagram form in order to facilitate describing the subject disclosure.

Hearing loss, e.g., hearing sensitivity loss, can be the result of naturally occurring phenomena, e.g., aging, genetics, etc., and environmental phenomena, e.g., loud working environments, medication, injury to the physiological structures related to hearing, etc. Hearing sensitivity loss can be non-uniform across different auditory frequencies, e.g., loss of sensitivity at a first frequency may be different from loss of sensitivity at a second frequency. Moreover, the frequency-sensitivity relationship, which is related to hearing sensitivity loss, can be different in each ear, e.g., the frequency-sensitivity in a person's left ear can differ from the frequency-sensitivity for the same person's right ear. One cause generally accepted as contributing to loss of hearing can be listening to sound sources at close range and at sufficiently high volumes that damage or injure the ear. Moreover, sufficiently loud sound can damage an ear, causing hearing sensitivity loss, over time, e.g., listening to loud music for long enough, especially via headphones, headsets, earbuds, etc., can be associated with hearing loss. In an aspect, hearing loss at a frequency that is associated with some portions of an audio signal can compound exposure to damaging sound pressure levels (SPLs), as an example, loss of sensitivity to frequencies associated with human speech can result in a listener, hereinafter also referred to as a user, increasing the overall volume of an audio source so as to allow them to hear the speech frequencies at an appreciable level despite this simultaneously increasing the volume of other frequencies, perhaps to a level that results in further reductions in hearing sensitivity at one or more frequencies via damage to the auditory physiology.

Conventional measurement of hearing sensitivity can be achieved through an acoustic sensor operated by trained professional or hearing specialist. This conventional technique can be expensive, can require travel to a doctor's office, can be subject to scheduling of an office visit, employs a trained professional, etc., which can lead to people being less likely to seek a hearing sensitivity loss evaluation. People seeking an evaluation of hearing sensitivity loss can often already be experiencing a noticeable level of hearing sensitivity loss, e.g., leading that person to question the hearing loss and to seek professional evaluation. Of note, the term 'hearing sensitivity loss' can be related to a difference between a baseline hearing sensitivity measurement and another hearing sensitivity measurement, can be associated with a deviation of a hearing sensitivity measurement from an accepted normal hearing sensitivity, etc., and can be employed interchangeably with other terms, e.g., 'loss of hearing,' 'impaired hearing sensitivity,' etc., herein, except where it is explicitly or implicitly employed as having another meaning.

Hearing sensitivity loss can be avoided, mitigated, reduced, or treated earlier where there are fewer impediments to discovery than associated with conventional hearing sensitivity analysis. In an aspect, the presently disclosed subject matter can provide for analysis of hearing sensitivity in real-time, or near real-time. This can be beneficial in allowing for reporting of analytical results much faster than seeking out specialized medical assistance. In an aspect, hearing sensitivity, or any loss thereof, can be tracked to determine changes that can indicate further evaluation, treatment, etc., may be needed or desirable. Further, changes in hearing sensitivity can be readily correlated to environmental conditions where they are captured in real-time, or near real-time, e.g., correlating hearing sensitivity loss to a SPL over a period of time, a frequency at a volume, a genera of music, differences between an external sound level and an headphone sound level, etc. Moreover, hearing sensitivity loss analysis information can be aggregated to enable analysis of classes, groups, etc. As an example, where hearing loss can be determined, based on aggregated hearing sensitivity loss analysis information, to be related to a peak SPL experienced before a certain age, audio devices can be adapted to not generate SPLs approaching the determined peak for users as a function of age.

Moreover, hearing sensitivity analysis can allow enhancement of an audio signal between an audio source and a listener. Enhancement of an audio signal can affect subsequent additional loss of hearing sensitivity. As an example, enhancing an audio signal by applying a first gain to a frequency associated with human speech and a lower second gain to other frequencies can allow a listener to experience the speech portion of an audio signal at a lower overall volume than would be experienced by applying the first gain to all frequencies. By reducing the volume, while still allowing a listener to hear the speech frequencies at an acceptable level, the likelihood of further hearing sensitivity loss can be reduced.

In an aspect, a listener can be associated with a hearing sensitivity model that can reflect the listener's auditory sensitivity, or hearing sensitivity loss, to a frequency, a set of frequencies, a frequency band, a set of frequency bands, etc. The model can, for one or more frequencies or frequency bands, comprise a threshold volume, SPL, etc., e.g., the point at which the listener indicates that a frequency or frequency band is audible; a comfort level, e.g., a volume that the listener indicates is comfortable; a ceiling level, e.g., where the listener indicates that additional volume is unacceptable; etc. In some embodiments, the model can comprise a representation of a listener's hearing sensitivity loss at a frequency or in a frequency band. Moreover, in certain embodiments, the hearing sensitivity model can reflect the listener's auditory sensitivity, or hearing sensitivity loss, correlated to one or more environments. As an example, the model can comprise information correlating listener sensitivity/loss, for one or more frequencies or frequency bands, in one or more environments, such as, a quiet room, near a busy roadway, in an office environment, on a commuter transit system, at a sporting event, in a quiet restaurant, in a noisy café, at an espresso stand, etc. The volume and frequencies of sounds in these environments can be associated with a listener's sensitivity, or lack thereof, in said environments. This can allow for enhancement of an audio signal that is responsive to a determined environment.

In an aspect, a hearing sensitivity model can be employed in enhancing an audio signal. In an embodiment, a hearing sensitivity model can be located local to, or remote from, a device employed in enhancing an audio signal. As an example, a hearing sensitivity model can be comprised in a headphone device to enable enhancing of an audio signal provided to the headphone before generating sound corresponding to the enhanced version of the audio signal. As another example, a user equipment (UE), e.g., a listener's smartphone, tablet computer, laptop computer, car audio system, etc., can receive a hearing sensitivity model from a remotely located server and apply audio enhancement based, at least in part, on the hearing sensitivity model to generate sound for the listener based on enhancement of an incoming audio signal. As a further example, a first hearing sensitivity model, associated with a first listener, and a second hearing sensitivity model, associated with a second listener, can be received by UE, such as a vehicle audio system device, to enable enhancement of an input audio signal, e.g., an MP3 file, to generate sound for the first listener and second listener, e.g., via vehicle speakers. This can allow for certain frequencies of the input audio signal to be enhanced to compensate for hearing sensitives of the first and second listener based on the first and second hearing sensitivity models. It will be appreciated that enhancing audio based on a plurality of models can comprise application of rules to balance, weight, rank, order, prioritize, etc., enhancements applied to an input audio signal. As an example, hearing sensitivity model for a listener, who is associated with ownership of a vehicle, can have higher priority for enhancement of an audio signal than a hearing sensitivity model for a passenger of the vehicle. As a further example, where enhancement based on a first model results in higher volume than a comfort level associated with a second model, the gain can be limited by the second model, e.g., where the first model is associated with a model demonstrating a profound loss of hearing and the second model is for a listener with normal hearing, a gain can be applied, based on the first model that could be unpleasant, or even dangerous, to the second listener, however, the gain indicated by the first model can be limited by the second model so that the resulting audio is less likely to be uncomfortable for the person with normal hearing while still being adapted for the higher sensitivity loss listener.

In an aspect, audio enhancement can comprise beamforming. In an embodiment, beamforming can be responsive to a reference signal, e.g., a second signal can be employed to modify a first signal. As an example, a left signal of a stereo audio input can be utilized to modify or normalize a right signal of the stereo audio input. In some embodiments, the reference signal can be a normalization signal, e.g., using an ambient audio spectrum measurement to adjust an input audio signal to a normal level. Beamforming can act as a first stage in audio enhancement as disclosed herein. In an example embodiment, beamforming with a double-beamformer employing two adaptive filters can provide a boost of, for example, about 6 dB to the SNR, however the presently disclosed subject matter is not limited to this example beamforming gain and other gains can be selected for a beamforming stage. In some embodiments, a second stage can comprise multichannel filtering to apply an adaptive gain as a function of frequency or frequency band. In an example embodiment, the adaptive gain controller can be a real-time, or near real-time adaptive gain controller. Further, some embodiments can employ multichannel filtering comprising adaptive gain control followed by dynamic range control to facilitate audio resolution and to reduce clip distortion as compared to embodiments without dynamic range control. In some embodiments, a hearing sensitivity model can enable adaptation of a signal via beamforming component, e.g., 130, 230, 330, etc., and/or adaptation of a signal via an adaptive amplifier component comprising adaptive gain control and dynamic range control, e.g., 140, 240, 440, etc. Of note, some embodiments of the presently disclosed subject matter can comprise a beamforming stage, an adaptive amplification stage, adaptive gain control, dynamic range control, combinations thereof, etc.

To the accomplishment of the foregoing and related ends, the disclosed subject matter, then, comprises one or more of the features hereinafter more fully described. The following description and the annexed drawings set forth in detail certain illustrative aspects of the subject matter. However, these aspects are indicative of but a few of the various ways in which the principles of the subject matter can be employed. Other aspects, advantages and novel features of the disclosed subject matter will become apparent from the following detailed description when considered in conjunction with the provided drawings.

FIG. 1 is an illustration of a system 100, which facilitates audio enhancement in accordance with an aspect of the subject disclosure. System 100 can comprise beamform component 130 that can receive input(s) 110. In an aspect, input(s) 110 can be one or more audio signal inputs. Input(s) 110 can be analog, digital, or a combination thereof. Moreover, input(s) 110 can be an analog signal passed through an analog-to-digital converter (ADC), an digital signal passed through an digital-to-analog converter (DAC), combinations thereof, etc. Further, input(s) 110 can comprise a raw audio signal, i.e., a signal that has not undergone audio processing, can comprise a preprocessed audio signal, such as a digital audio signal that has been under/over sampled, filtered, enhanced, mixed, etc., or combinations thereof.

Beamform component 130 can modify input(s) 110 before passing the resulting signal to adaptive filter component 140. In an embodiment, beamform component 130 can pass input(s) 110 to adaptive amplifier component 140 directly and without alteration or modification of input(s) 110. In other embodiments, beamform component 130 can pass input(s) 110 to adaptive amplifier component 140 directly and without alteration or modification other than an introducing a delay to input(s) 110. In still other embodiments, beamform component 130 can modify input(s) 110 before passing the resulting signal to adaptive amplifier component 140 or other components, such as a hearing sensitivity modeling component, a hearing sensitivity loss analysis component, etc., not illustrated herein for the sake of clarity and brevity.

Modification of input(s) 110 by beamform component 130 can comprise combining a first input of input(s) 110 with another signal. In an embodiment, the combining can comprise combining a weighted signal corresponding to the first input with another weighted signal. In an aspect, the weightings can be selected to provide a desired effect, for example the first signal can be weighted at 0.5 and the second signal can be weighted at 0.5 such that they have equivalent effect when added; they can be weighted 0.75 to 0.25 to have a disproportionate effect when added; they can be weighted 0.4 to 0.35 to 0.25 where three weighted signals are added with disproportionate effect; etc. An example of the other signal can include environmental noise, e.g., corresponding to an inversion of a real-time environmental noise signal enabling noise cancelling of environmental noise in the resulting signal send from beamform component 130 to adaptive amplifier component 140. Another example of the other signal can include an input corresponding to a corollary audio signal, e.g., for stereo audio, the first input can be a 'left' audio channel and the other signal can be a 'right' audio channel.

Figure 3:
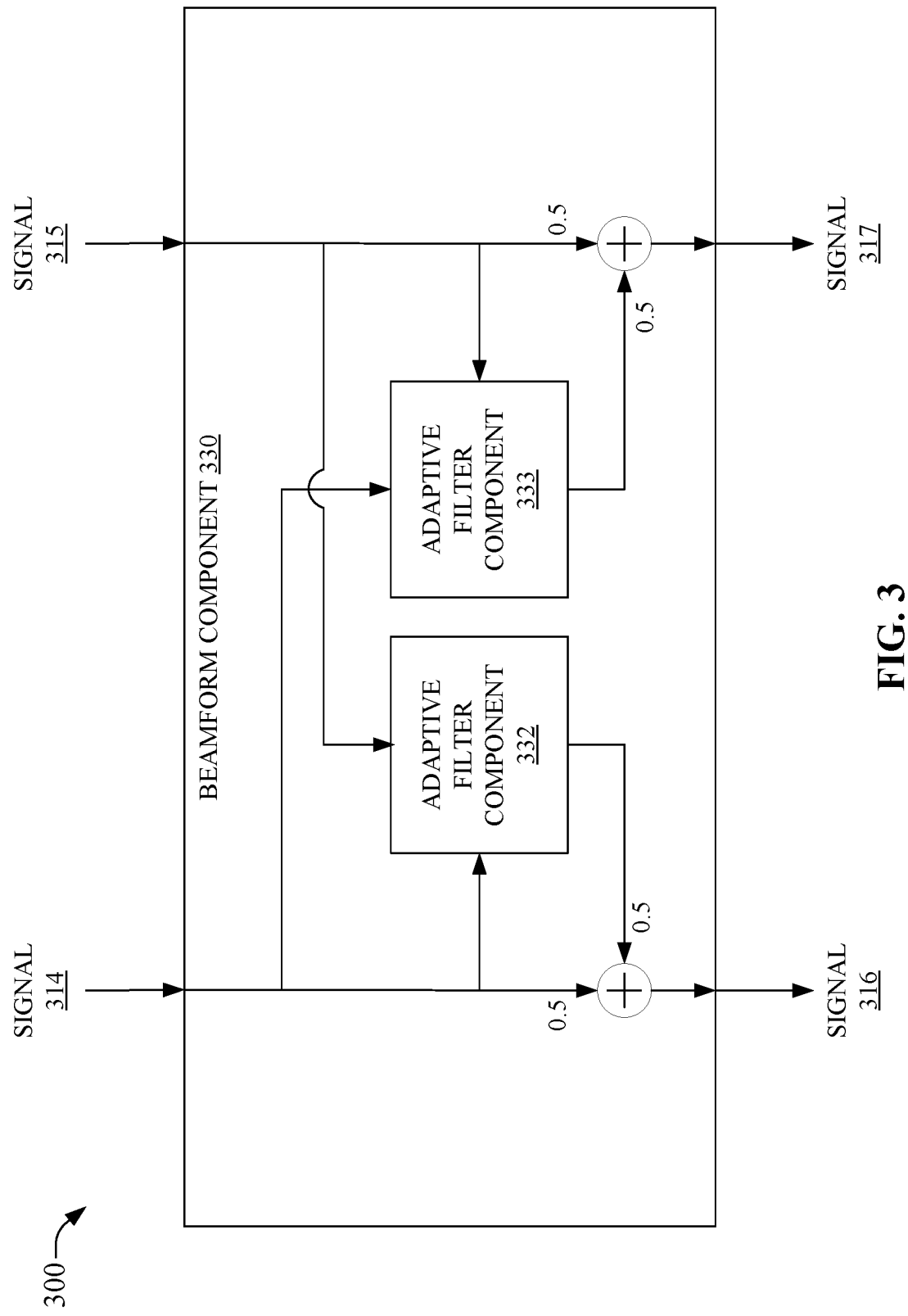
FIG. 3 illustrates an example system that facilitates audio enhancement via double-beamforming in accordance with aspects of the subject disclosure.

In an example embodiment, after ADC and preprocessing, such as digital filtering to remove transients introduced by the ADC process, input(s) 110 can comprise a first input signal corresponding to a first microphone, and a second input signal corresponding to a second microphone. Of note, the ADC and preprocessing can be the same or different, and can occur separately and distinctly, can be performed together, etc. As examples, ADC for the first microphone can be 8-bit while ADC for the second microphone can be 24-bit; ADC for the first microphone can occur at a first device while ADC for the second microphone can occur at a second device; preprocessing of the post-ADC for the first microphone and second microphone can occur together at a third device, etc. The first and second inputs, e.g., input(s) 110, for this example embodiment can then be separately filtered, weighted, and additively combined with the other signal before being passed to adaptive filter component 140. This cross-wise filtering, weighting, and additive combining can be termed 'double-beamforming,' see, for example, FIG. 3 illustrating an embodiment of a system 300 that can enable double-beamforming. A double-beamformer therefore can comprise two adaptive filters that can use the signal of one microphone, e.g., the first input of this example embodiment, to approximate the signal of the other one, e.g., the second input of this example embodiment, such that the first input can act as a reference for the second microphone, and the second input can act as a reference for the first microphone. In this example embodiment, double-beamforming can provide, for example, an additional 6 dB SNR before passing the resulting signals to the adaptive amplifier component 140. It will be noted that additional inputs can be accommodated, e.g., to give a triple-beamformer, a quad-beamformer, etc.

System 100 can further comprise adaptive amplifier component 140 that can receive a signal corresponding to one or more of input(s) 110 from beamform component 130. In an aspect, adaptive amplifier component 140 can apply gain to a received signal resulting in output(s) 190 corresponding to one or more of input(s) 110. In some embodiments, adaptive amplifier component 140 can apply different gain to different frequencies or bands of frequencies for each signal received, e.g., the signals corresponding to the one or more input(s) 110. Therefore, in an aspect, adaptive amplifier component 140 can apply one or more gains to one or more signals corresponding to the one or more input(s) 110. As an example a first, second, and third gain can be applied to a first, second and third frequency band of a first and second signal, while a fourth gain can be applied to the first frequency band of a third signal, the first gain can be applied to the second frequency band of the third signal, and no gain may be applied to the third frequency band of the third signal. As another example, a first signal can correspond to a 'left input' and a second signal can correspond to a 'right input', whereby a gain can be applied to a frequency band associated with human speech as perceived by a listener, e.g., based on a hearing sensitivity model as disclosed elsewhere herein. Where the listener perceives speech in the 8-11 kHz range in the left ear and in the 8.5-13 kHz in the right ear, and has hearing loss in the 10-14 kHz range of the left ear and better than normal hearing sensitivity in the right ear, the adaptive amplifier component 140 of this example can apply unity gain to the 8-10 kHz portions of the first signal, a positive gain to the 10-11 kHz portions of the first signal, other gain(s) to other portions of the first signal, a negative gain to the 8.5-13 kHz portion of the second signal, and other gain(s) to other portions of the second signal. This application of gains can result in enhanced audio for the listener providing louder volumes in the portions of the speech frequencies in the left ear and decreased volumes in the right ear, hopefully resulting in the overall audio sounding clearer and more balanced to the listener, which can allow the listener to keep the SPLs at lower levels (e.g., by only applying gain to the frequencies where the listener is deficient) to reduce the likelihood of further hearing damage. Moreover, where the listener, via analysis of hearing sensitivity loss, indicates that the enhanced sound is deficient, this can indicate in real-time, or near real-time, that the listener may be experiencing further degradation of hearing sensitivity, which can be reported, with or without analytical information, to an audiologist, etc.

Adaptive amplifier component 140 can generate output(s) 190 that can be enhanced signals that correspond to one or more of input(s) 110. In some embodiments, the enhanced signals, e.g., generated by adaptive amplifier component 140, can be converted into analog and/or digital signals comprised in output(s) 190. As examples, output(s) 190 can drive headphone speakers, can be suited to pre-amplifier input for a public address (PA) system, can be transmitted digitally over a wireless interface to a wireless headset, etc.

In an aspect, adaptive amplifier component 140 can comprise an adaptive gain controller (AGC) as disclosed herein. An AGC can, in an aspect, maintain an average signal power within a determined range in M different frequency bands, respectively. The AGC can, for example, be implemented by an M-channel filter bank corresponding to the M selected frequency bands. In each of the M channels of this example filter bank, a gain can be applied to a filtered signal to adaptively adjust the signal power in said frequency band with respect to a hearing curve, e.g., a hearing sensitivity, a hearing sensitivity loss, a hearing sensitivity model, etc. Further, in this example, a subsequent noise suppression procedure can be applied before the output of the M channels is weighted and summed.

In another aspect, adaptive amplifier component 140 can comprise a dynamic range controller (DRC), also as disclosed herein. A DRC, in an aspect, can adapt a dynamic range of an output signal. As an example, a level limiter can be followed by a digital-analogue hybrid gain controller to reduce clip distortion and improve resolution. In an aspect, a DRC can provide bulk gain to a signal corresponding to an input of input(s) 110, while an AGC can provide gain to one or more frequencies comprising the signal. This aspect can result, for example, in an enhanced audio signal, e.g., an output of output(s) 190, that is both frequency adapted and amplified, while maintaining acceptable dynamic range characteristics.

Figure 2:
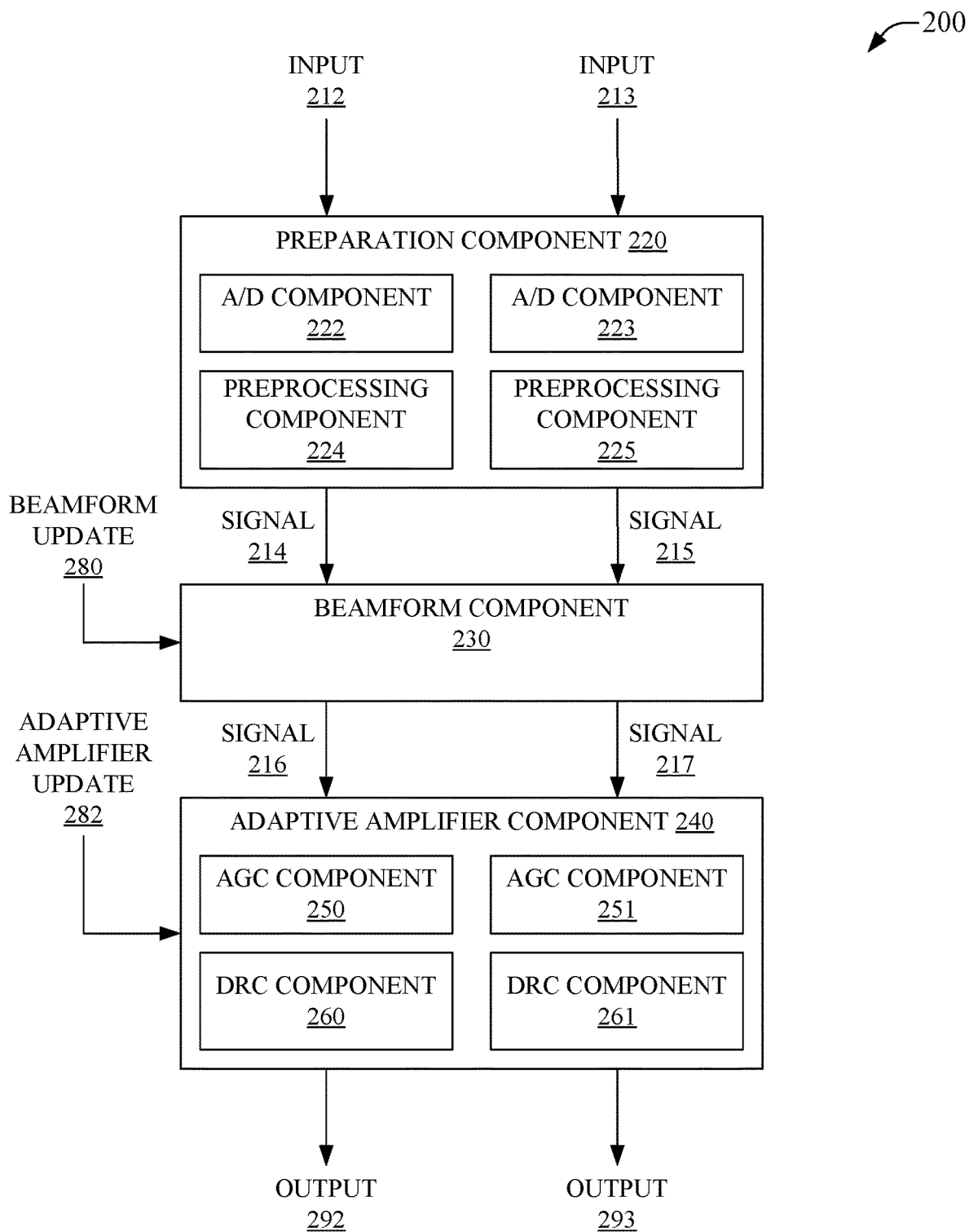
FIG. 2 is a depiction of an example system that facilitates audio enhancement via beamforming and adaptive amplification in accordance with aspects of the subject disclosure.

FIG. 2 is a depiction of a system 200 that can facilitate audio enhancement via beamforming and adaptive amplification in accordance with aspects of the subject disclosure. System 200 can comprise preparation component 220 that can receive input 212 and input 213. The inputs, 212 and 213, can comprise analog or digital audio information. Preparation component 220 can comprise one or more parallel input processing streams, for example, a first input processing stream can comprise A/D component 222 and preprocessing component 224, wherein A/D component 222 can perform analog to digital conversion via an ADC where input 212 comprises analog audio information. Similarly, for example, a second and parallel input processing stream can comprise A/D component 223 and preprocessing component 225, wherein A/D component 223 can perform analog to digital conversion via another ADC where input 213 comprises analog audio information. For the sake of clarity the parallel nature of system 200 is illustrated in FIG. 2, although for the sake of brevity, extensive discussion of the parallel components is avoided where adequate description may have been already provided elsewhere herein. With regard to preprocessing component 224, and similarly for 225 with regard to input 213, can further process input 212, over/under sampling, filtering, modifying, mixing, etc. In an aspect preparation component 220 facilitates system 200 receiving audio information in nearly any format, e.g., input 212, 213, and preparing it, in the form of signal 214, 215, to be received by beamform component 230. As an example, where input 212 is an analog audio signal, this can be converted to a digital signal at A/D component 222 and then filtered and oversampled at preprocessing component 224 before being sent, as signal 214, to beamform component 230. As another example, where input 213 is a digital file comprising a recording of an audio performance, input 213 can be converted into a digital audio stream, filtered, amplified, and sampled, before being sent, as signal 215, to beamform component 230. As a further example, input 212 can comprise analog information on ambient sounds and input 213 can comprise stereo digital information. In this example, A/D/component 22 can convert the ambient sound to digital format which can then be subtracted from each stereo channel of input 213 by preprocessing component 225 before a first stereo channel is sent as signal 214 and a second complementary stereo channel is sent as signal 215 to beamform component 230. Alternatively, in the is example, input 212 can be converted to digital information by A/D component 222, undergo preprocessed via preprocessing component 224, and be sent, as signal 214 to beamform component 230, while stereo input 213 can be preprocessed at preprocessing component 225 and be sent, as signal 215, to beamform component 230 where, rather than being performed at preparation component 220, the background audio can be removed from the stereo audio, e.g., at beamform component 230 rather than at preparation component 220. The disclosed scope of preparation component 220 is intended to comprise highly flexible handling, management, and preparation of one or more inputs, e.g., 212, 213, etc., in a variety of formats, e.g., line in, pre-amp in, mic out, digital files comprising audio information (MP3, AVI, etc.), or nearly any other input format comprising audio information or encodings thereof, into one or more signals, e.g., 214, 215, etc., that can be received and readily processed by beamform component 230 without significant further input-side processing.

In an embodiment, system 200 can comprise beamform component 230 that can receive signal 214 and signal 215. In some embodiments additional signals can be received, although not illustrate here for the sake of clarity and brevity. In an aspect, signal 214, and similarly 215, can correspond to one or more of input 214, 213, etc., which can be analog, digital, or a combination thereof.

Beamform component 230 can modify signal(s), e.g., signal 214 and/or 215, before passing the resulting signal to adaptive filter component 240. In an embodiment, beamform component 230 can pass signal(s) to adaptive amplifier component 240 directly and without alteration or modification. In other embodiments, beamform component 230 can introduce a timing delay, such as to accommodate synchronization of signals experiencing time lag due to processing via components of the systems, methods, etc., discloses herein, before passing the signal(s) to adaptive amplifier component 240 without other alteration or modification. In further embodiments, beamform component 230 can modify signal(s) before passing the resulting signal to adaptive amplifier component 240 or other components, such as a hearing sensitivity modeling component, a hearing sensitivity loss analysis component, etc.

Modification of signal(s) by beamform component 230 can comprise combining a first signal, e.g., signal 214, with another signal, e.g., signal 215. In an embodiment, the combining can comprise first weighting one or more of the signal(s), before combining them. In an aspect, weighting of one or more signal(s) can be determined to provide a desired effect, for example equal weighting of two or more signals, disproportionate weighting of a signal to give it more or less effect than another differently weighted signal, etc. Beamform component 230 can pass signal(s), e.g., 216, 217, etc., based on one or more of signals 214, 215, etc., to adaptive amplifier component 240.

In a further aspect, beamform component 230 can receive beamform update 280. Beamform update 280 can comprise information related to operation of beamform component 230, such as rules relating to determining weighting of one or more signal(s), which signal(s) to operate on, allowed formats for input signal(s), e.g., 214, 215, etc., allowed formats for output signal(s), e.g., 216, 217, etc., timing information related to introducing delay into one or more output signal(s), e.g., 216, 217, etc., or other information relevant to providing beamforming operations.

System 200 can further comprise adaptive amplifier component 240 that can receive, from beamform component 230, a signal, e.g., one or more of 216, 217, etc., corresponding to one or more of input, e.g., 212, 213, etc. In an aspect, adaptive amplifier component 240 can apply gain to a received signal resulting in output(s) 292, 293, etc., corresponding to one or more of input, e.g., 212, 213, etc. In some embodiments, adaptive amplifier component 240 can apply different gain to different frequencies, or bands of frequencies, for each signal, e.g., 216, 217, etc., received. Therefore, in an aspect, adaptive amplifier component 240 can apply one or more gains to one or more signals corresponding to the one or more input, e.g., 212, 213, etc. As an example a first gain can be applied to a first frequency band of signal 216, while a second gain can be applied to the first frequency band of signal 217, and a third gain can be applied to a second frequency band of signal 216 and signal 217. Of note, a gain can be a unity gain, a positive gain, a negative gain, or a null gain. As another example, signal 214 can correspond to a 'left input' and signal 215 can correspond to a 'right input', whereby a gain can be applied to a frequency band from 15-20 kHz. Based on information from a user profile, such as a hearing sensitivity model for a user associated with the user profile, it can be determined that the left input needs a higher gain than the right input because the associated user has better hearing in the right ear for this frequency band. As such, in this example, a higher gain can be applied to the 15-20 kHz components of signal 214 than a gain applied to the 15-20 kHz components of signal 215. This application of gains can result in enhanced audio for a listener providing louder volumes in the 15-20 kHz region for the left ear as compared to the right ear, e.g., a left speaker will play louder for these frequencies than a right speaker. This can allow the listener to keep the overall volume lower to experience satisfactory experience of the 15-20 kHz audio, which can result in lower overall SPLs than would otherwise be experienced to get similar experience of the 15-20 kHz audio. Where the SPLs are indeed reduced, there can be a corresponding decrease in the likelihood of further hearing damage. Moreover, analysis of hearing sensitivity/loss based on listener satisfaction with the enhanced audio can indicate that the listener may have recently experienced further degradation of hearing sensitivity, which can be reported, with or without analytical information, to an audiologist, etc.

Adaptive amplifier component 240 can generate output(s), e.g., 292, 293, etc., that can be enhanced signals that correspond to one or more of input 216, 217, etc. In an aspect, adaptive amplifier component 240 can comprise an adaptive gain controller (AGC) component 250, as disclosed herein. Similarly, adaptive amplifier component 240 can also comprise parallel AGC component 251, that can be the same as, or similar to, AGC component 250. AGC component 250, in an aspect, can adjust signal power in different frequency bands. AGC component 250, for example, can be implemented by an M-channel filter bank corresponding to M selected frequency bands. In each of the M channels, a gain can be applied to a filtered signal, e.g., signal 216 is filtered into M channels by M filters, to adaptively adjust the signal power in said frequency band with respect to a determined gain value for the corresponding frequency or frequency band, e.g., a gain value based on a hearing sensitivity model, a hearing sensitivity loss model, etc. The M channels can then be recombined after application of the frequency based gains. The recombined signal can then be passed to dynamic range controller (DRC) component 260, also as disclosed herein. Similarly, signal 217 can be passed through AGC component 251, then to DRC 261.

DRC component 260, and similarly 261, in an aspect, can adapt a dynamic range of an output signal, e.g., output 292, 293, etc. DRC 260 can receive the recombined signal from AGC component 250. In an embodiment, the recombined signal can then be level limited to remove or reduce the effect of amplification beyond a determined range. The level limited signal of the embodiment can then have a digital gain applied based on the average and peak level of the level limited signal. Digital gain information can be employed in level limiting a next instant of the recombined signal, e.g., the digital gain information, in this embodiment, can be used as control information for additional level limiting of the recombined signal stream received by DRC component 260. The interplay of level limiting and digital gain can enable adaptation of clip distortion and resolution. The digitally amplified signal of the embodiment can then be passed to DAC and the resulting analog signal can then be amplified. In this embodiment, signal 292 can comprise this analog amplified signal from DRC component 260. AGC component 251 and DRC component 261 can be the same or similar to 250 and 260 but can be used to process signal 217 into output 293, e.g., in parallel to the processing of signal 216 into output 292 via AGC component 250 and DRC component 260. This disclosed embodiment can result, for example, in an enhanced audio signal, e.g., output 292, 293, etc., that is both frequency adapted and amplified, while maintaining acceptable dynamic range characteristics. In another embodiment, the M channels at AGC 250 are not recombined and DRC component 260 can enable level limiting, digital amplification, DAC, and applying analog gain before recombining the channels in to output 292. While numerous other embodiments are readily appreciated, for the sake of clarity and brevity, they are not explicitly recited herein but are still to be considered within the scope of the instant disclosure.

Adaptive amplifier component 240 can further receive adaptive amplifier update 282. Adaptive amplifier update 282 can comprise information related to the operation of adaptive amplifier component 240, including AGC component 250 operation, such as a hearing sensitivity model or information related thereto, rules relating determining the value of M, e.g., how many channels is an output broken into for filtering and frequency dependent gain adaptation, determining one or more frequency band width, determining one or more gain to apply to a channel of the M channels, rules related to increasing/decreasing gains based on power level, noise suppression rules, etc. Similarly, adaptive amplifier update 282 can comprise information related to the operation of adaptive amplifier component 240, including operation of DRC component 260, rule(s) on level limiting, digital gain, analog gain, etc., rule(s) related to increasing/decreasing gains based on power level, rule(s) related to increasing/decreasing gains based on a level of signal clipping, rule(s) related to increasing/decreasing gains based on balancing analog and digital gains, rule(s) related to DAC, etc.

FIG. 3 illustrates a system 300 that facilitates audio enhancement via double-beamforming in accordance with aspects of the subject disclosure. System 300 can comprise beamform component 330 that can receive signal 314 and signal 315. In an aspect, signal 314 or signal 315 can be audio signal inputs. Signal 314 or signal 315 can be analog audio signal inputs, digital audio signal inputs, or a combination thereof. Moreover, signal 314 or signal 315 can be from an ADC, a DAC, or a combination thereof. Further, signal 314 or signal 315 can comprise a raw audio signal, or a processed audio signal, such as a digital audio signal that has been under/over sampled, filtered, enhanced, mixed, etc., or combinations thereof.

Beamform component 330 can modify signal 314 or signal 315 into an output signal, e.g., signal 316 or signal 317. Modification of signal 314 or signal 315 by beamform component 330 can comprise combining signal 314 with another signal, e.g., signal 315, and combining signal 315 with another signal, e.g., signal 314. In an embodiment, the combining can comprise weighting an input signal, e.g., 314 or 315, and combining it with another weighted signal, e.g., from adaptive filter component 332, 333, etc. The weightings can be determined to provide a determined effect, for example equal weighting of two or more signals, disproportionate weighting of a signal to give it more or less effect than another differently weighted signal, etc., for example signal 314 can be weighted at 0.5 and the other signal, e.g., from adaptive filter component 332, can be weighted at 0.5, such that they have equivalent effect when summed into signal 316.

In an embodiment, the input signals, e.g., signal 314 and 315, can be employed by beamform component 330 to modify another signal, e.g., signal 314 can be employed in modifying signal 315 to result in signal 317, signal 315 can be employed in modifying signal 314 to result in signal 316, etc. As an example, a left signal, e.g., signal 314, of a stereo audio input can be utilized to modify a right signal, e.g., signal 315, of the stereo audio input. System 300 illustrates an example 'double-beamformer' that comprises adaptive filter component 332 and 333. Adaptive filter component 332, or 333, can receive signal 314 and 315 and generate an output signal that can be summed with an input signal, e.g., 314, 315, to form an output signal, e.g., 316 317. The summing can be weighted, wherein system 300 illustrates the inputs to the summer as each having a weight of 0.5. The double-beamformer can provide a boost of, for example, about 6 dB, however the presently disclosed subject matter is not limited to this example beamforming gain.

Figure 4:
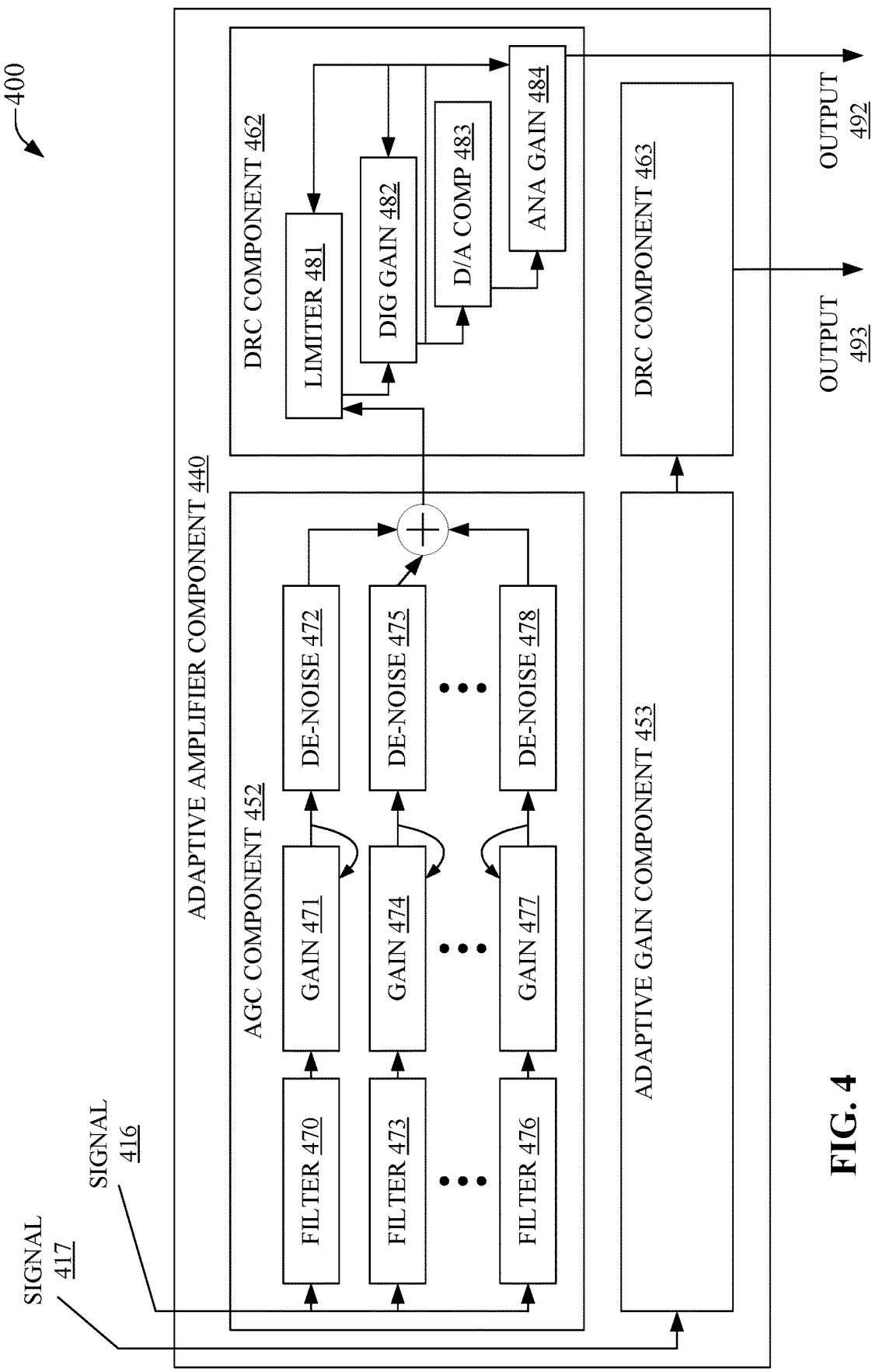
FIG. 4 illustrates an example system that facilitates audio enhancement via adaptive gain and dynamic range control in accordance with aspects of the subject disclosure.

FIG. 4 illustrates a system 400 that facilitates audio enhancement via adaptive gain and dynamic range control in accordance with aspects of the subject disclosure. System 400 can comprise adaptive amplifier component 440 that can receive a signal, e.g., signal 416, 417, etc., and can apply gain to a received signal resulting in an output, e.g., 492, 493, etc. In some embodiments, adaptive amplifier component 440 can apply different gain to different frequencies, or bands of frequencies, for each signal received, e.g., signal 416, 417, etc.

In an aspect, adaptive amplifier component 440 can comprise adaptive gain controller (AGC) component, e.g., AGC component 452, AGC component 453, etc., as disclosed herein. In an aspect, each AGC component, 452, 454, etc., can function in parallel with other AGC components, e.g., each AGC component can process an incoming signal, e.g., 416, 417, etc., in parallel. Moreover, although only AGC component 452 and AGC component 454 are illustrated for clarity and brevity, system 400 is expressly not so limited and can comprise additional AGC components, for example, to parallel process additional incoming signals. In some embodiments, an AGC component, such as 452, can be multiplexed to allow a lower number of AGC components to process a larger number of incoming signals, e.g., AGC component 425 can be multiplexed to facilitate processing of both signal 416 and 417.

In another aspect, AGC component 450 can adjust signal power in different frequency bands comprising an input signal, e.g., 416, 417, etc. AGC component 452, for example, can be implemented by an M-channel filter bank corresponding to M selected frequency bands, e.g., filter 470 can filter a first channel, filter 473 can filter a second channel, . . . , filter 476 can filter a $M^{th}$ channel, etc. In each of the M channels, for example M can be 1, 2, 8, 256, 300, 1000 channels, etc., a gain can be applied to a filtered signal, e.g., gain 471 can be applied to the filtered signal of the first channel, gain 474 can be applied to the filtered signal of the second channel, . . . , gain 477 can be applied to the filtered signal of the $M^{th}$ channel, etc. In an aspect, the gain value can be based on a hearing sensitivity model, a hearing sensitivity loss model, etc. The amplified filtered signal can be employed in determining if the gain should be increased/decreased for the next portion of the filtered signal entering the gain component, e.g., 471, or similarly 474, 477, etc. In an embodiment, the gain of gain component 471 can be adapted based on the results of applying the gain to an incoming filtered signal, e.g., as part of a feedback loop to adapt the gain. Further, the amplified filtered signal can be passed through a de-noise component, e.g., 472, 475, 478, etc., to improve the signal before the M channels can then be recombined via a summing element of AGC component 452. The recombined signal, e.g., the signal output from the summing element, can then be passed to dynamic range controller (DRC) component 462, also as disclosed herein. Similarly, signal 417 can be passed through AGC component 453 in W channels, which can be the same or a different number of channels as M channels, before being summed and passed to DRC component 463.

DRC component 462, and similarly 463, in an aspect, can adapt a dynamic range of an output signal, e.g., output 492, 493, etc. DRC 462 can receive the recombined signal from AGC component 452, DRC 463 can receive the recombined signal from AGC component 453, etc. In an embodiment, a recombined signal, for example, from AGC component 452, can then be level limited via limiter component 481 of DRC component 462 to remove or reduce the effect of signal amplification exceeding a determined signal range. The level limited signal can then have a digital gain applied via digital gain component 482. In an embodiment, the digital gain can be based on the average and peak level of the level limited signal from limiter component 481. Digital gain information can further be employed in level limiting a next instant of the recombined signal, e.g., the digital gain of digital gain component 482 can be adapted up/down based on the results of applying the digital gain to an incoming limited signal from limiter component 481, e.g., as part of a feedback loop to adapt the digital gain employed at digital gain component 482. The interplay of level limiting and digital gain can enable adaptation of clip distortion and resolution seen in resulting outputs signals, e.g., output 492, 493, etc. The digitally amplified signal can then be passed to D/A component 483 and the resulting analog signal can then be amplified via analog gain component 484. Signal 492 can comprise this analog amplified signal from DRC component 462. AGC component 453 and DRC component 463 can be the same as, or similar to, AGC component 452 and DRC component 462 but can be used to process signal 417 into output 493, e.g., in parallel to the processing of signal 416 into output 492 via AGC component 452 and DRC component 462.

Adaptive amplifier component 440 can generate output(s), e.g., 492, 493, etc., that can be enhanced signals that correspond to one or more of input signal(s), e.g., 416, 417, etc. In some embodiments, the enhanced signals, e.g., generated by adaptive amplifier component 440, can be converted into analog and/or digital signals comprised in output 492, 493, etc. As examples, output 492, 493, etc., can drive headphone speakers, can be a pre-amplifier level signal for a public address (PA) system, can be transmitted digitally over a wireless interface to a wireless headset, etc.

In view of the example system(s) described above, example method(s) that can be implemented in accordance with the disclosed subject matter can be better appreciated with reference to flowcharts in FIG. 5-FIG. 8. For purposes of simplicity of explanation, example methods disclosed herein are presented and described as a series of acts; however, it is to be understood and appreciated that the claimed subject matter is not limited by the order of acts, as some acts may occur in different orders and/or concurrently with other acts from that shown and described herein. For example, one or more example methods disclosed herein could alternatively be represented as a series of interrelated states or events, such as in a state diagram. Moreover, interaction diagram(s) may represent methods in accordance with the disclosed subject matter when disparate entities enact disparate portions of the methods. Furthermore, not all illustrated acts may be required to implement a described example method in accordance with the subject specification. Further yet, two or more of the disclosed example methods can be implemented in combination with each other, to accomplish one or more aspects herein described. It should be further appreciated that the example methods disclosed throughout the subject specification are capable of being stored on an article of manufacture (e.g., a computer-readable medium) to allow transporting and transferring such methods to computers for execution, and thus implementation, by a processor or for storage in a memory.

Figure 5:
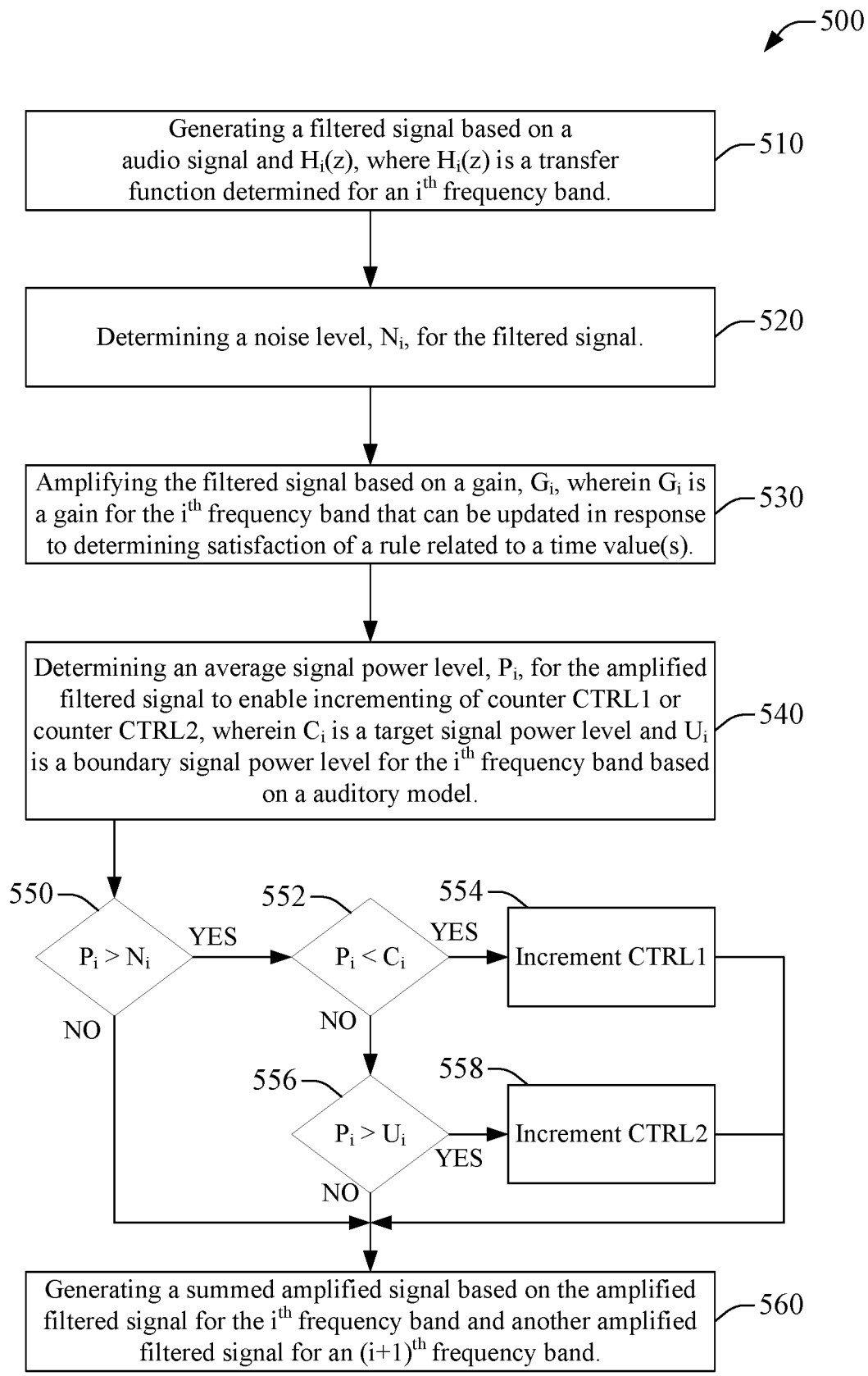
FIG. 5 illustrates an example method enabling audio enhancement via adaptive gain as a function of frequency band in accordance with aspects of the subject disclosure.

FIG. 5 illustrates a method 500 enabling audio enhancement via adaptive gain as a function of frequency band in accordance with aspects of the subject disclosure. System 500 can comprise, at 510, generating a filtered signal based on an audio signal and a transfer function determined for the $i^{th}$ frequency band, e.g., $H_i(z)$. $H_i(z)$ can be applied to the audio signal to convolve a filtered signal. In an aspect, this can be performed for each frequency band comprising the audio signal to break the audio signal into, for example, M channels. At 520, a noise level, $N_i$ can be determined for each filtered signal, e.g., the filtered signal from 510.

At 530, the filtered signal from 510 can be amplified based on a gain $G_i$, where $G_i$ is a gain for the $i^{th}$ frequency band. $G_i$ can be updated in response to determining that a rule related to a time value(s) has be satisfied. As disclosed herein, each frequency band can be associated with a separate gain value that can be independently updated. This can allow for each frequency band to be amplified independently, typically based on a model associated with a listener, before later bulk amplification is performed, e.g., the raw signal can be adjusted by frequency band before bulk amplification is performed allowing for an enhanced and personalized audio signal that can be sent to a device associated with the listener.

At 540 an average signal power level, $P_i$, for the amplified filtered signal can be determined. This can facilitate incrementing counter CTRL1 or counter CTRL2, wherein $C_i$ is a target signal power level and $U_i$ is a boundary signal power level for the $i^{th}$ frequency band based on an auditory model. At 550 if the average signal power level is greater than the determined noise level, method 500 proceeds to 552, else method 500 proceeds to 560. At 552, is the average signal power level is more than the target signal power level, method 500 proceeds to 554 where CTRL1 is incremented and then proceeds to 560. However, if at 552, the average signal power level is not greater than the target signal power level, method 500 proceeds to 556. At 556, if the average signal power level is more than the boundary signal power level, method 500 proceeds to 558 where CTRL2 is incremented and then proceeds to 560. If at 556, the average signal power level is not greater than the boundary signal power level, method 500 proceeds to 560.

At 560, method 500 generates a summed amplified signal based on the amplified filtered signal for the $i^{th}$ frequency band and another amplified filtered signal for an $(i+1)^{th}$ frequency band. At this point, method 500 can end. In an aspect, at 550, where the average signal power level is not greater than the determined noise level, e.g., the signal and the noise are similar which suggest that there is not signal in the frequency band, then method 500 can avoid checking conditions that would be associated with a signal being present, e.g., at 552 and at 556, before proceeding to summing of the several frequency bands back in to a 'whole' audio signal at 560. Moreover, where a signal is present above the noise at 550, then the power level can be checked against a target power level, e.g., a determined goal power level after application of the gain for that particular frequency band at 552. Where average power level is below the target power level then CTRL1 can be incremented which, as will be seen in method 600, can relate to adjusting the gain of that frequency band at 622. Where the average power level is not below the target level, e.g., where the gain is sufficient to meet or exceed the target power level, then a check can be made, e.g., at 556, to see that the average power level is equal to or less than a boundary level, e.g., at or less than a ceiling power level. Where the average poser level has exceed the boundary level, CTRL2 can be incremented which, as seen in method 600, can result in adjusting the gain to correct for excessive gain if found at 556.

Figure 6:
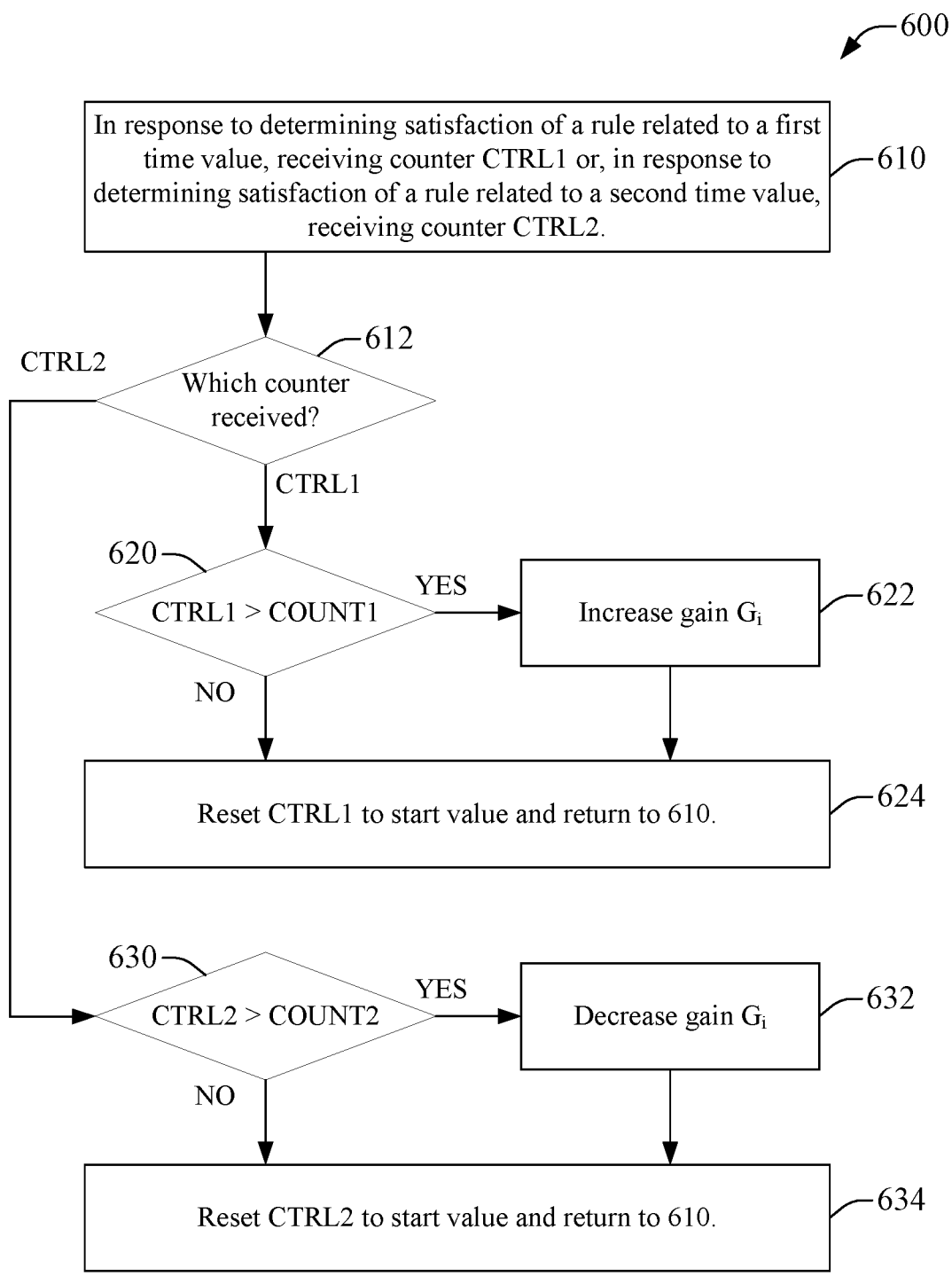
FIG. 6 illustrates an example method facilitating adapting a gain in response to analysis of a characteristic of an audio signal in accordance with aspects of the subject disclosure.

FIG. 6 illustrates a method 600 facilitating adapting a gain in response to analysis of a characteristic of an audio signal in accordance with aspects of the subject disclosure. At 610, method 600 can comprise receiving counter CTRL1, see 554 from method 500, in response to determining satisfaction of a rule related to a first time value, or, in response to determining satisfaction of a rule related to a second time value, receiving counter CTRL2, see 558 from method 500. Method 600 can interact with method 500 to be responsive to conditions determined in method 500 and to adjust/reset values employed in checking conditions in method 500, e.g., CTRL1 and/or CTRL2.

In method 600, the first and second time values and associated rules found at 610, enable incremental review of the gain being applied to the $i^{th}$ frequency band in method 500. As an example, where first time has elapsed, the first rule can be satisfied allowing for a check of the gain in relation to CTRL1, e.g., determining if the gain is too low based on too few instances of the average power level not reaching the target power level in the first elapsed time. As another example, the rule related to the first time value can start a counter in response to CTRL1 being non-zero, such that where CTRL1 is zero, the time may not be checked and where CTRL1 becomes non-zero, then a temporal check can then be made. Further, satisfaction of the second time value rule, in some embodiments, can be distinct from satisfaction of the first time value rule. As an example, the first time value rule can check CTRL1 every five minutes and the second time value rule can check CTRL2 ten minutes after initiation of a system employing method 500. Of note, many other permutation s of time value rules, e.g., temporal base rules, are readily apparent and are within the scope of the instant disclosure even where not explicitly recited for the sake of clarity and brevity.

At 612, it can be determined which counter is received at 610. Where the received counter is CTRL1, method 600 advances to 620, where CTRL2 is received, method 600 moves to 630. At 620, it is determined if CTRL1 is greater than a value COUNT1. Where CTRL1 is greater than COUNT1, the gain for the $i^{th}$ frequency band is increased at 622 and then CTRL1 is reset to a start value at 624 before method 600 returns to 610. At this point method 600 can end.

Where at 612, it is determined that CTRL2 was received at 610, method 600 moves to 630 and it is determined if CTRL2 exceeds a value COUNT2. Where CTRL2 is greater than COUNT2, method 600 moves to 632 and the gain for the $i^{th}$ frequency band is decreased before CTRL2 is reset to a start value and method 600 returns to 610. At this point method 600 can also end.

Figure 7:
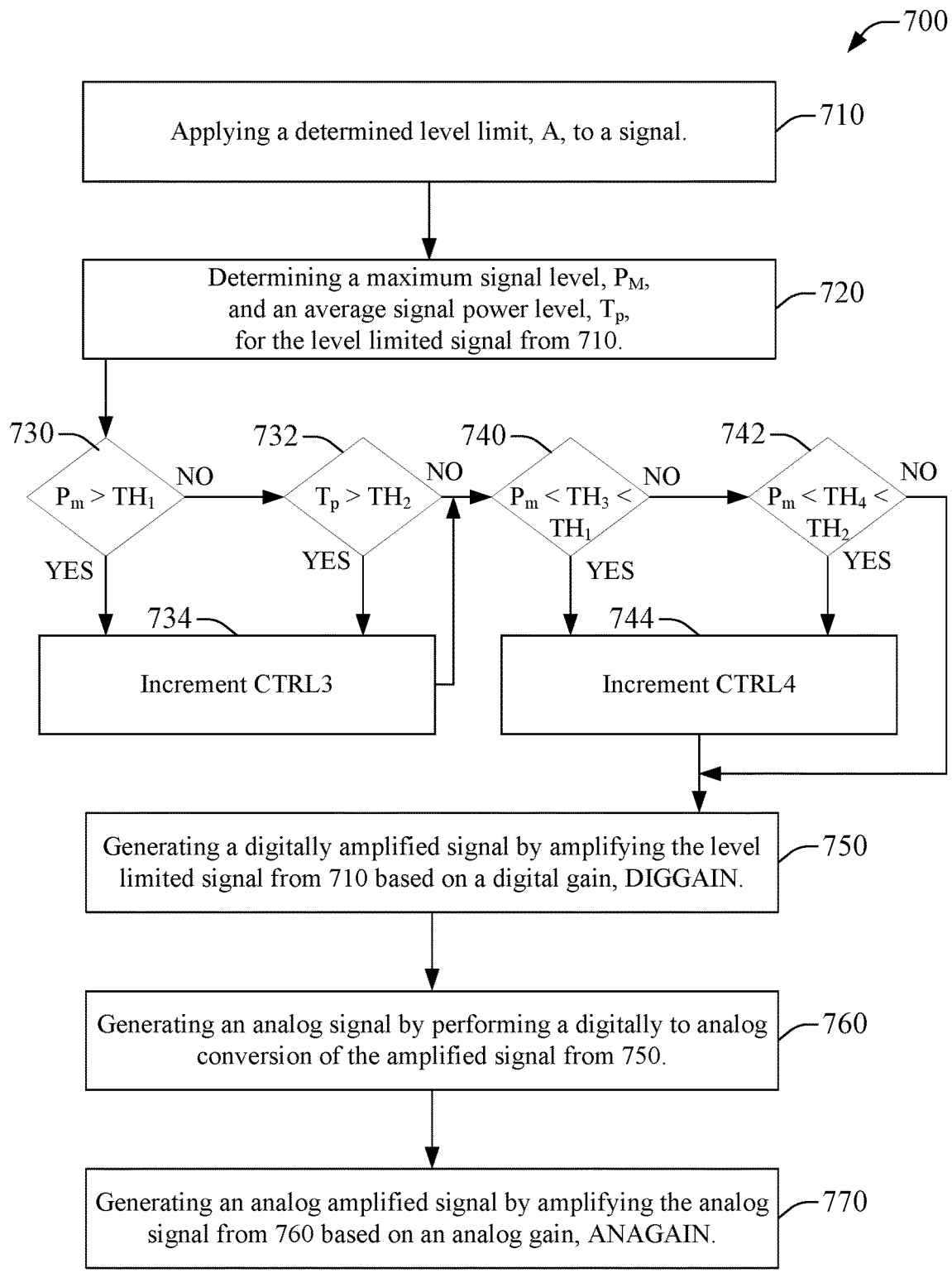
FIG. 7 depicts an example method enabling dynamic range control of an audio signal in accordance with aspects of the subject disclosure.

FIG. 7 illustrates a method 700 that facilitates dynamic range control of an audio signal in accordance with aspects of the subject disclosure. At 710, method 700 can comprise apply a determined level limit, A, to a signal. In an aspect, this signal can be a summed amplified signal, such as, a signal generated, as disclosed herein, by an adaptive gain controller component. Applying a level limit can prevent propagation of signal above a determined threshold. In some embodiments, applying a level limit can also take the form of compression, e.g., where gain reduction ratios are less abrupt than typically associated with level limiting, for example with ratios under 10:1, etc.; brick wall limiting, e.g., where gain reduction ratios are very high, for example with ratios above 20:1; etc., to reduce the dynamic range of an incoming signal. Level limiting can be based on peak or RMS values of the incoming signal and can use a hard or soft knee response curve. At 720, method 700 can determining a maximum signal level, $P_M$, and an average signal power level, $T_p$, for the level limited signal from 710.

Method 700, at 730, can determine if the maximum signal level, $P_M$, is greater than a first saturation detection threshold level, $TH_1$. Where $P_M > TH_1$, method 700 can increment counter CTRL3 at 734 then proceed to 740, otherwise method 700 can proceed to 732. At 732, if the average signal power level, $T_p$, is greater than a second saturation detection threshold level, $TH_2$, then CTRL3 is incremented at 734 before method 700 advances to 740, otherwise method 700 advances to 740 without incrementing CTRL3.

At 740, method 700 proceeds to 744 if the maximum signal level, $P_M$, is less than a third saturation detection threshold level, $TH_3$, where $TH_3$ is also less than the first saturation detection threshold level, $TH_1$, e.g., $P_M < TH_3 < TH_1$, and proceeds to 742 if the maximum signal level, $P_M$, is not less than the third saturation detection threshold level, $TH_3$. At 742, method 700 proceeds to 744 if the maximum signal level, $P_M$, is less than a fourth saturation detection threshold level, $TH_4$, where $TH_4$ is also less than the second saturation detection threshold level, $TH_2$, e.g., $P_M < TH_4 < TH_2$, and proceeds to 750 if the maximum signal level, $P_M$, is not less than the fourth saturation detection threshold level, $TH_4$. At 744 CTRL4 can be incremented before method 700 proceeds to 750. In an aspect, the difference between $TH_3$ and $TH_1$ can affect a sensitivity to incrementing counter CTRL3 which can be related, as seen in method 800, to increasing the determined level limit, A, and correspondingly adapting digital and analog gains applied in method 700. As an example, $TH_3$ can be about ½ $TH_1$, but is not so limited and, in other examples, can be any value less than $TH_1$. Similarly, the difference between $TH_4$ and $TH_2$ can affect a sensitivity to incrementing counter CTRL4 which can be related, as seen in method 800, to decreasing the determined level limit, A, and correspondingly adapting digital and analog gains applied in method 700. As an example, $TH_4$ can be about ½ $TH_2$, but is not so limited and, in other examples, can be any value less than $TH_2$.

At 750, a digitally amplified signal can be generated based on amplifying the level limited signal from 710 according to a determined digital gain value, DIGGAIN. DIGGAIN can be adapted as illustrated in method 800. Method 700, at 760, can comprise converting the digitally amplified signal from 750 into an analog signal via a DAC. At 770, an analog gain, ANAGAIN, can be applied to the analog signal generated at 760. At this point method 700 can end. ANAGAIN can also be adapted as illustrated in method 800.

Figure 8:
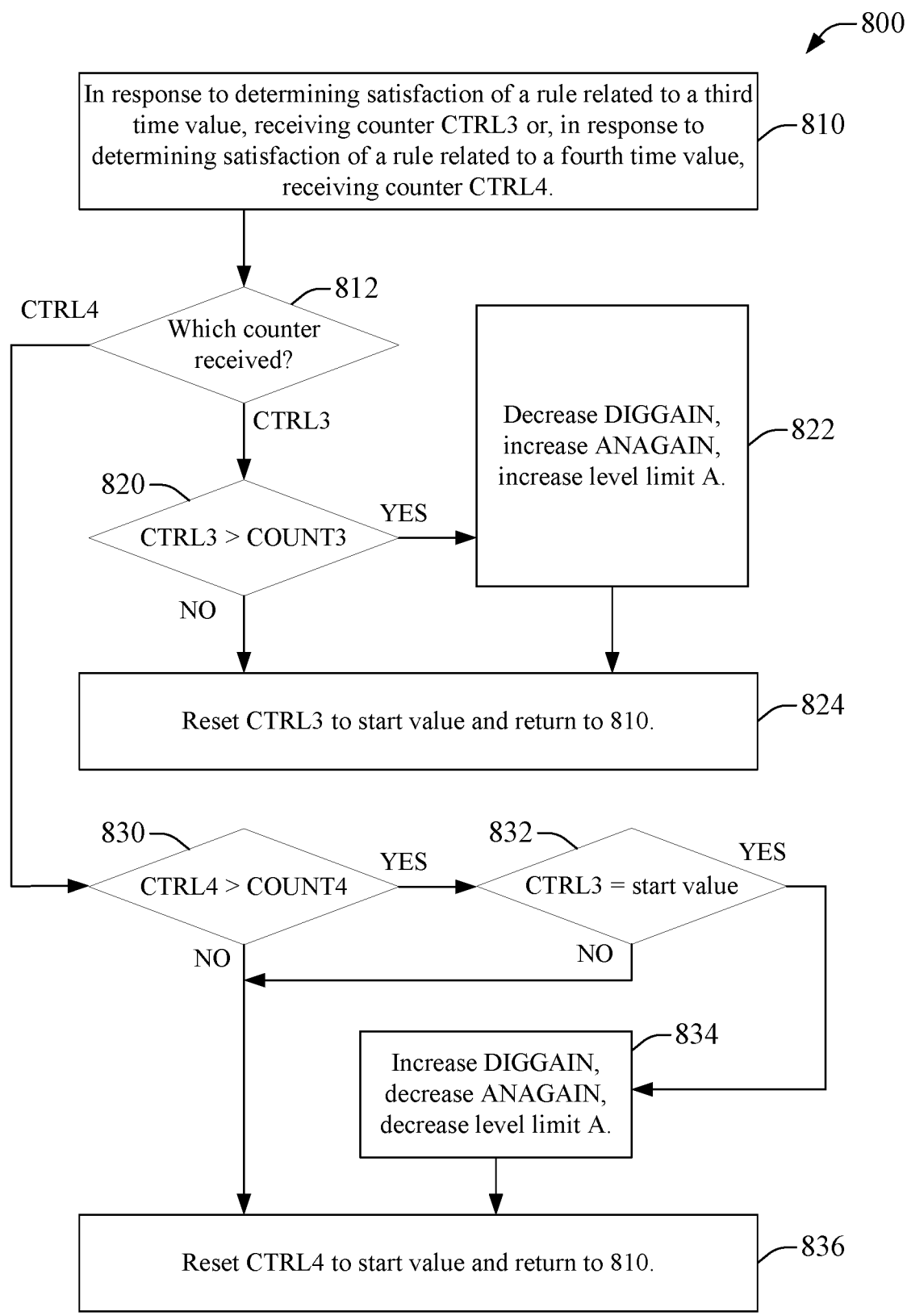
FIG. 8 illustrates an example method facilitating adapting dynamic range control in response to analysis of a characteristic of an audio signal in accordance with aspects of the subject disclosure.

FIG. 8 illustrates a method 800 that facilitates adapting dynamic range control in response to analysis of a characteristic of an audio signal in accordance with aspects of the subject disclosure. At 810, method 800 can comprise receiving counter CTRL3, see 734 from method 700, in response to determining satisfaction of a rule related to a third time value, or, in response to determining satisfaction of a rule related to a fourth time value, receiving counter CTRL4, see 744 from method 700. Method 800 can interact with method 700 to be responsive to conditions determined in method 700 and to adjust/reset values employed in checking conditions in method 700, e.g., CTRL3 and/or CTRL4.

In method 800, the third and fourth time values and associated rules found at 810 facilitate review and/or adaptation of the DIGGAIN, ANAGAIN, and level limit values being employed in method 700. At 812, it can be determined which counter is received at 810, e.g., either CTRL3 or CTRL4. Where the received counter is CTRL3, method 800 can advance to 820, where CTRL4 is received, method 800 can move to 830.

At 820, it is determined if CTRL3 is greater than a value COUNT3. Where CTRL3 is greater than COUNT3, method 800 can go to 822 and otherwise proceeds to 824. At 822, method 800 can decrease DIGGAIN, increase ANAGAIN, and increase level limit, A. The behavior at 822 can be attributed to the maximum power level and the average signal power level determined at 720 of method 700 being greater than their corresponding saturation detection thresholds, a situation that can be associated with excessive digital gain or over level limiting of an input signal. The behavior at 822 can act as a corrective factor by decreasing DIGGAIN and increasing A. Further, increasing ANAGAIN can compensate for the decrease in DIGGAIN. At 824, method 800 can reset CTRL3 to a start value and return to 810. At this point, method 800 can end.

Where at 812, it is determined that CTRL4 was received at 810, method 800 can moves to 830 and determined if CTRL4 exceeds a value COUNT4. Where CTRL4 is greater than COUNT4, method 800 can move to 832 and otherwise can move to 836. At 832, where CTRL3 is equal to the start value, e.g., where the actions at 824 have occurred, where CTRL3 has not yet been incremented, etc., method 800 can go to 834, otherwise method 800 can advance to 836. At 834, method 800 can increase DIGGAIN, decrease ANAGAIN, and decrease level limit, A. The behavior at 834 can be attributed to the maximum power level and the average signal power level, determined at 720 of method 700, not exceeding their corresponding lower limits which are less than their corresponding saturation detection thresholds, a situation that can be associated with too little digital gain or under level limiting of an input signal, e.g., $P_M$ and $T_p$, can be below their corresponding lower limits. The behavior at 834 can act as a corrective factor by increasing DIGGAIN and decreasing A, and correspondingly decreasing ANAGAIN to compensate for the increase in DIGGAIN. Method 800 can then go to 836, where CTRL4 can be reset to a start value and method 800 can return to 810. At this point, method 800 can also end.

Figure 9:
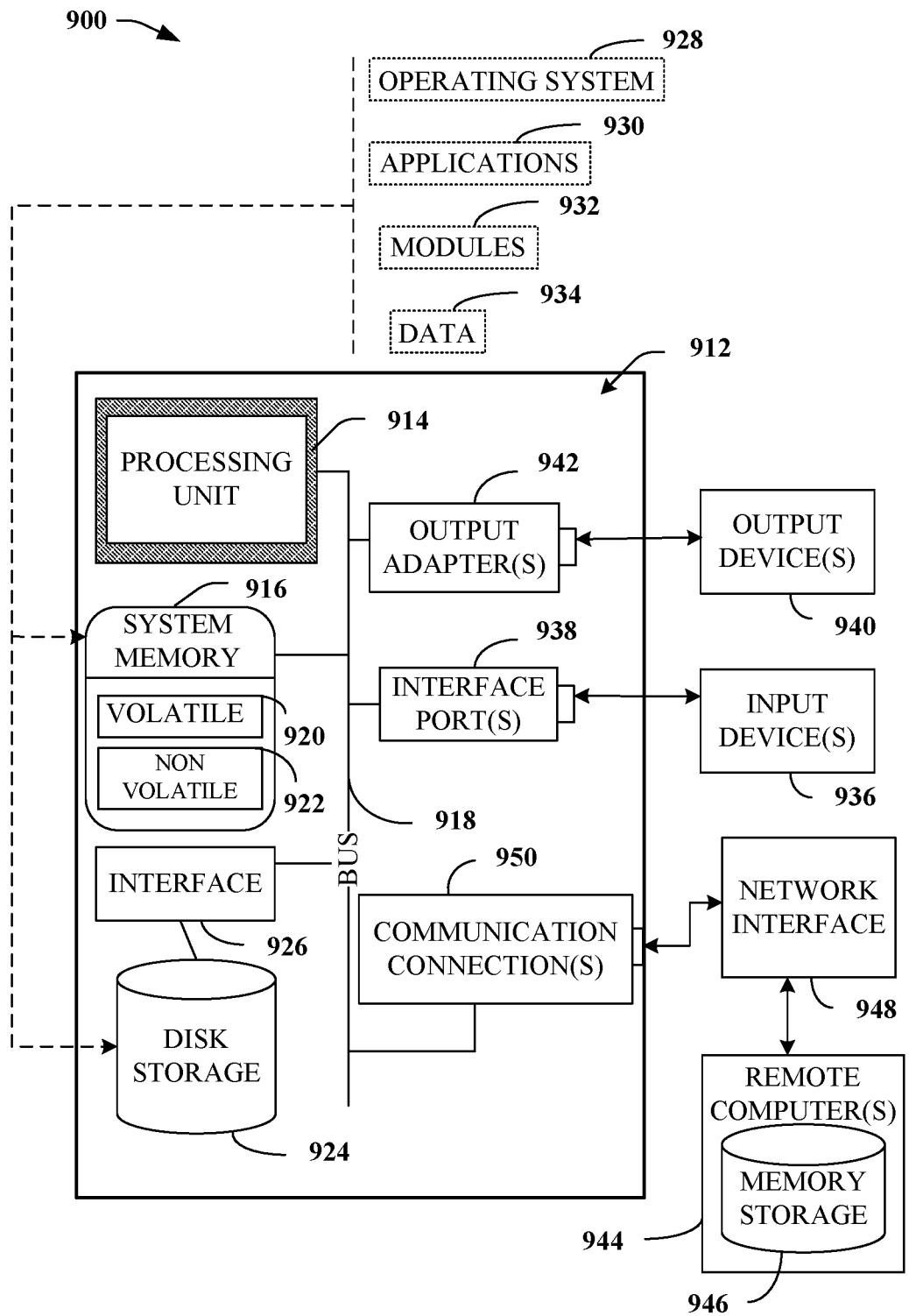
FIG. 9 illustrates an example block diagram of a computing system operable to execute the disclosed systems and methods in accordance with an embodiment.

In order to provide a context for the various aspects of the disclosed subject matter, FIG. 9, and the following discussion, are intended to provide a brief, general description of a suitable environment in which the various aspects of the disclosed subject matter can be implemented. While the subject matter has been described above in the general context of computer-executable instructions of a computer program that runs on a computer and/or computers, those skilled in the art will recognize that the disclosed subject matter also can be implemented in combination with other program modules. Generally, program modules comprise routines, programs, components, data structures, etc. that performs particular tasks and/or implement particular abstract data types.

In the subject specification, terms such as "store," "storage," "data store," data storage," "database," and substantially any other information storage component relevant to operation and functionality of a component, refer to "memory components," or entities embodied in a "memory" or components comprising the memory. It is noted that the memory components described herein can be either volatile memory or nonvolatile memory, or can comprise both volatile and nonvolatile memory, by way of illustration, and not limitation, volatile memory 920 (see below), non-volatile memory 922 (see below), disk storage 924 (see below), and memory storage 946 (see below). Further, nonvolatile memory can be included in read only memory, programmable read only memory, electrically programmable read only memory, electrically erasable read only memory, or flash memory. Volatile memory can comprise random access memory, which acts as external cache memory. By way of illustration and not limitation, random access memory is available in many forms such as synchronous random access memory, dynamic random access memory, synchronous dynamic random access memory, double data rate synchronous dynamic random access memory, enhanced synchronous dynamic random access memory, Synchlink dynamic random access memory, and direct Rambus random access memory. Additionally, the disclosed memory components of systems or methods herein are intended to comprise, without being limited to comprising, these and any other suitable types of memory.

Moreover, it is noted that the disclosed subject matter can be practiced with other computer system configurations, comprising single-processor or multiprocessor computer systems, mini-computing devices, mainframe computers, as well as personal computers, hand-held computing devices (e.g., personal digital assistant, phone, watch, tablet computers, netbook computers, . . . ), microprocessor-based or programmable consumer or industrial electronics, and the like. The illustrated aspects can also be practiced in distributed computing environments where tasks are performed by remote processing devices that are linked through a communications network; however, some if not all aspects of the subject disclosure can be practiced on stand-alone computers. In a distributed computing environment, program modules can be located in both local and remote memory storage devices.

FIG. 9 illustrates a block diagram of a computing system 900 operable to execute the disclosed systems and methods in accordance with an embodiment. Computer 912, which can be, for example, beamform component 130, 230, 330, etc., adaptive amplifier component 140, 240, 440, etc., preparation component 220, etc., AGC component 452, 453, etc., DRC component 462, 463, etc., can comprise a processing unit 914, a system memory 916, and a system bus 918. System bus 918 couples system components comprising, but not limited to, system memory 916 to processing unit 914. Processing unit 914 can be any of various available processors. Dual microprocessors and other multiprocessor architectures also can be employed as processing unit 914.

System bus 918 can be any of several types of bus structure(s) comprising a memory bus or a memory controller, a peripheral bus or an external bus, and/or a local bus using any variety of available bus architectures comprising, but not limited to, industrial standard architecture, microchannel architecture, extended industrial standard architecture, intelligent drive electronics, video electronics standards association local bus, peripheral component interconnect, card bus, universal serial bus, advanced graphics port, personal computer memory card international association bus, Firewire (Institute of Electrical and Electronics Engineers 1194), and small computer systems interface.

System memory 916 can comprise volatile memory 920 and nonvolatile memory 922. A basic input/output system, containing routines to transfer information between elements within computer 912, such as during start-up, can be stored in nonvolatile memory 922. By way of illustration, and not limitation, nonvolatile memory 922 can comprise read only memory, programmable read only memory, electrically programmable read only memory, electrically erasable read only memory, or flash memory. Volatile memory 920 comprises read only memory, which acts as external cache memory. By way of illustration and not limitation, read only memory is available in many forms such as synchronous random access memory, dynamic read only memory, synchronous dynamic read only memory, double data rate synchronous dynamic read only memory, enhanced synchronous dynamic read only memory, Synchlink dynamic read only memory, Rambus direct read only memory, direct Rambus dynamic read only memory, and Rambus dynamic read only memory.

Computer 912 can also comprise removable/non-removable, volatile/non-volatile computer storage media. FIG. 9 illustrates, for example, disk storage 924. Disk storage 924 comprises, but is not limited to, devices like a magnetic disk drive, floppy disk drive, tape drive, flash memory card, or memory stick. In addition, disk storage 924 can comprise storage media separately or in combination with other storage media comprising, but not limited to, an optical disk drive such as a compact disk read only memory device, compact disk recordable drive, compact disk rewritable drive or a digital versatile disk read only memory. To facilitate connection of the disk storage devices 924 to system bus 918, a removable or non-removable interface is typically used, such as interface 926.

Computing devices typically comprise a variety of media, which can comprise computer-readable storage media or communications media, which two terms are used herein differently from one another as follows.

Computer-readable storage media can be any available storage media that can be accessed by the computer and comprises both volatile and nonvolatile media, removable and non-removable media. By way of example, and not limitation, computer-readable storage media can be implemented in connection with any method or technology for storage of information such as computer-readable instructions, program modules, structured data, or unstructured data. Computer-readable storage media can comprise, but are not limited to, read only memory, programmable read only memory, electrically programmable read only memory, electrically erasable read only memory, flash memory or other memory technology, compact disk read only memory, digital versatile disk or other optical disk storage, magnetic cassettes, magnetic tape, magnetic disk storage or other magnetic storage devices, or other tangible media which can be used to store desired information. In this regard, the term "tangible" herein as may be applied to storage, memory or computer-readable media, is to be understood to exclude only propagating intangible signals per se as a modifier and does not relinquish coverage of all standard storage, memory or computer-readable media that are not only propagating intangible signals per se. In an aspect, tangible media can comprise non-transitory media wherein the term "non-transitory" herein as may be applied to storage, memory or computer-readable media, is to be understood to exclude only propagating transitory signals per se as a modifier and does not relinquish coverage of all standard storage, memory or computer-readable media that are not only propagating transitory signals per se. Computer-readable storage media can be accessed by one or more local or remote computing devices, e.g., via access requests, queries or other data retrieval protocols, for a variety of operations with respect to the information stored by the medium. As such, for example, a computer-readable medium can comprise executable instructions stored thereon that, in response to execution, cause a system comprising a processor to perform operations, comprising: receiving information, e.g., audio information, such as input(s) 110, 212, 213, etc., signals 214-217, 314-315, 416-417, etc., and in response, generating adapted and/or enhanced audio signals, e.g., outputs 190, 292-293, 492-493, etc., signals 214-217, 316-317, etc.

Communications media typically embody computer-readable instructions, data structures, program modules or other structured or unstructured data in a data signal such as a modulated data signal, e.g., a carrier wave or other transport mechanism, and comprises any information delivery or transport media. The term "modulated data signal" or signals refers to a signal that has one or more of its characteristics set or changed in such a manner as to encode information in one or more signals. By way of example, and not limitation, communication media comprise wired media, such as a wired network or direct-wired connection, and wireless media such as acoustic, RF, infrared and other wireless media.

It can be noted that FIG. 9 describes software that acts as an intermediary between users and computer resources described in suitable operating environment 900. Such software comprises an operating system 928. Operating system 928, which can be stored on disk storage 924, acts to control and allocate resources of computer system 912. System applications 930 take advantage of the management of resources by operating system 928 through program modules 932 and program data 934 stored either in system memory 916 or on disk storage 924. It is to be noted that the disclosed subject matter can be implemented with various operating systems or combinations of operating systems.

A user can enter commands or information into computer 912 through input device(s) 936. In some embodiments, a user interface can allow entry of user preference information, user satisfaction information, user experience information, etc., and can be embodied in a touch sensitive display panel, a mouse input GUI, a command line controlled interface, etc., allowing a user to interact with computer 912. As an example, a UI component of a smartphone, tablet computer, laptop computer, wearable computer, etc., can receive touch, motion, audio, visual, or other types of input. Input devices 936 comprise, but are not limited to, a pointing device such as a mouse, trackball, stylus, touch pad, keyboard, microphone, joystick, game pad, satellite dish, scanner, TV tuner card, digital camera, digital video camera, web camera, cell phone, smartphone, tablet computer, etc. These and other input devices connect to processing unit 914 through system bus 918 by way of interface port(s) 938. Interface port(s) 938 comprise, for example, a serial port, a parallel port, a game port, a universal serial bus, an infrared port, a Bluetooth port, an IP port, or a logical port associated with a wireless service, etc. Output device(s) 940 use some of the same type of ports as input device(s) 936.

Thus, for example, a universal serial busport can be used to provide input to computer 912 and to output information from computer 912 to an output device 940. Output adapter 942 is provided to illustrate that there are some output devices 940 like monitors, speakers, and printers, among other output devices 940, which use special adapters. Output adapters 942 comprise, by way of illustration and not limitation, video and sound cards that provide means of connection between output device 940 and system bus 918. It should be noted that other devices and/or systems of devices provide both input and output capabilities such as remote computer(s) 944.

Computer 912 can operate in a networked environment using logical connections to one or more remote computers, such as remote computer(s) 944. Remote computer(s) 944 can be a personal computer, a server, a router, a network PC, cloud storage, a cloud service, code executing in a cloud-computing environment, a workstation, a microprocessor based appliance, a peer device, or other common network node and the like, and typically comprises many or all of the elements described relative to computer 912.

For purposes of brevity, only a memory storage device 946 is illustrated with remote computer(s) 944. Remote computer(s) 944 is logically connected to computer 912 through a network interface 948 and then physically connected by way of communication connection 950. Network interface 948 encompasses wire and/or wireless communication networks such as local area networks and wide area networks. Local area network technologies comprise fiber distributed data interface, copper distributed data interface, Ethernet, Token Ring and the like. Wide area network technologies comprise, but are not limited to, point-to-point links, circuit-switching networks like integrated services digital networks and variations thereon, packet switching networks, and digital subscriber lines. As noted below, wireless technologies may be used in addition to or in place of the foregoing.

Communication connection(s) 950 refer(s) to hardware/software employed to connect network interface 948 to bus 918. While communication connection 950 is shown for illustrative clarity inside computer 912, it can also be external to computer 912. The hardware/software for connection to network interface 948 can comprise, for example, internal and external technologies such as modems, comprising regular telephone grade modems, cable modems and digital subscriber line modems, integrated services digital network adapters, and Ethernet cards.

The above description of illustrated embodiments of the subject disclosure, comprising what is described in the Abstract, is not intended to be exhaustive or to limit the disclosed embodiments to the precise forms disclosed. While specific embodiments and examples are described herein for illustrative purposes, various modifications are possible that are considered within the scope of such embodiments and examples, as those skilled in the relevant art can recognize.

In this regard, while the disclosed subject matter has been described in connection with various embodiments and corresponding Figures, where applicable, it is to be understood that other similar embodiments can be used or modifications and additions can be made to the described embodiments for performing the same, similar, alternative, or substitute function of the disclosed subject matter without deviating therefrom. Therefore, the disclosed subject matter should not be limited to any single embodiment described herein, but rather should be construed in breadth and scope in accordance with the appended claims below.

As it employed in the subject specification, the term "processor" can refer to substantially any computing processing unit or device comprising, but not limited to comprising, single-core processors; single-processors with software multithread execution capability; multi-core processors; multi-core processors with software multithread execution capability; multi-core processors with hardware multithread technology; parallel platforms; and parallel platforms with distributed shared memory. Additionally, a processor can refer to an integrated circuit, an application specific integrated circuit, a digital signal processor, a field programmable gate array, a programmable logic controller, a complex programmable logic device, a discrete gate or transistor logic, discrete hardware components, or any combination thereof designed to perform the functions described herein. Processors can exploit nano-scale architectures such as, but not limited to, molecular and quantum-dot based transistors, switches and gates, in order to optimize space usage or enhance performance of user equipment. A processor may also be implemented as a combination of computing processing units.

As used in this application, the terms "component," "system," "platform," "layer," "selector," "interface," and the like are intended to refer to a computer-related entity or an entity related to an operational apparatus with one or more specific functionalities, wherein the entity can be either hardware, a combination of hardware and software, software, or software in execution. As an example, a component may be, but is not limited to being, a process running on a processor, a processor, an object, an executable, a thread of execution, a program, and/or a computer. By way of illustration and not limitation, both an application running on a server and the server can be a component. One or more components may reside within a process and/or thread of execution and a component may be localized on one computer and/or distributed between two or more computers. In addition, these components can execute from various computer readable media having various data structures stored thereon. The components may communicate via local and/or remote processes such as in accordance with a signal having one or more data packets (e.g., data from one component interacting with another component in a local system, distributed system, and/or across a network such as the Internet with other systems via the signal). As another example, a component can be an apparatus with specific functionality provided by mechanical parts operated by electric or electronic circuitry, which is operated by a software or firmware application executed by a processor, wherein the processor can be internal or external to the apparatus and executes at least a part of the software or firmware application. As yet another example, a component can be an apparatus that provides specific functionality through electronic components without mechanical parts, the electronic components can comprise a processor therein to execute software or firmware that confers at least in part the functionality of the electronic components.

In addition, the term "or" is intended to mean an inclusive "or" rather than an exclusive "or." That is, unless specified otherwise, or clear from context, "X employs A or B" is intended to mean any of the natural inclusive permutations. That is, if X employs A; X employs B; or X employs both A and B, then "X employs A or B" is satisfied under any of the foregoing instances. Moreover, articles "a" and "an" as used in the subject specification and annexed drawings should generally be construed to mean "one or more" unless specified otherwise or clear from context to be directed to a singular form.

Further, the term "include" is intended to be employed as an open or inclusive term, rather than a closed or exclusive term. The term "include" can be substituted with the term "comprising" and is to be treated with similar scope, unless otherwise explicitly used otherwise. As an example, "a basket of fruit including an apple" is to be treated with the same breadth of scope as, "a basket of fruit comprising an apple."

Furthermore, the terms "user," "subscriber," "customer," "consumer," "prosumer," "agent," and the like are employed interchangeably throughout the subject specification, unless context warrants particular distinction(s) among the terms. It should be appreciated that such terms can refer to human entities or automated components (e.g., supported through artificial intelligence, as through a capacity to make inferences based on complex mathematical formalisms), that can provide simulated vision, sound recognition and so forth.

What has been described above includes examples of systems and methods illustrative of the disclosed subject matter. It is, of course, not possible to describe every combination of components or methods herein. One of ordinary skill in the art may recognize that many further combinations and permutations of the claimed subject matter are possible. Furthermore, to the extent that the terms "includes," "has," "possesses," and the like are used in the detailed description, claims, appendices and drawings such terms are intended to be inclusive in a manner similar to the term "comprising" as "comprising" is interpreted when employed as a transitional word in a claim.

What is claimed is:

1. A system, comprising:
    a processor; and
    a memory that stores executable instructions that, when executed by the processor, facilitate performance of operations, comprising:
        in response to receiving an input comprising information related to a first input audio signal, generating a first intermediate signal based on a first adaptation of the first input audio signal, wherein the first adaptation enables removal of an environmental noise from the first input audio signal, wherein the generating the first intermediate signal is further based on a second input audio signal different than the first input audio signal, and wherein the second input audio signal is employed to determine an adaptive filtering of the first input audio signal;
        receiving a first gain profile corresponding to a first identity of a first individual proximate to a location, wherein the first gain profile comprises a first gain for a first frequency band of the first intermediate signal and a second gain to a second frequency band of the first intermediate signal;
        in response to determining that the first gain profile satisfies a selection rule based on a second gain profile corresponding to a second identity of a second individual proximate to the location, adjusting the first gain profile based on the second gain profile, wherein the first gain profile is determined to have a higher priority than the second gain profile based on the first identity and the second identity; and
        generating an output to generate sound for the first individual associated with the first identity, wherein the output is based on a second adaptation of the first intermediate signal, wherein the output signal comprises information related to an enhanced first audio signal, wherein the second adaptation comprises a first channel signal determined in response to applying the first gain of the first gain profile to the first frequency band of the first intermediate signal and a second channel signal determined in response to applying the second gain of the first gain profile to the second frequency band of the first intermediate signal.

2. The system of claim 1, wherein the first adaptation of the first input audio signal comprises subtracting a noise signal from the first input audio signal.

3. The system of claim 1, wherein the input further comprises the second input audio signal, and wherein a third adaptation comprises adapting the second input audio signal based on the first input audio signal.

4. The system of claim 1, wherein the output comprises a first enhanced audio output signal that corresponds to the first input audio signal and comprises a summation of signals comprising the first channel signal and the second channel signal.

5. The system of claim 4, wherein the output further comprises a second enhanced audio output signal that corresponds to a third channel signal determined in response to applying a third gain of the first gain profile to a first frequency band of a second intermediate signal and determining a fourth channel signal in response to applying a fourth gain of the first gain profile to a second frequency band of the second intermediate signal.

6. The system of claim 1, wherein the second adaptation further comprises:
    applying a level limit function to a summation of signals comprising the first channel signal and the second channel signal resulting in a level limited signal;
    applying a digital gain to the level limited signal resulting in an amplified, level limited signal; and
    applying an analog gain to an analog signal resulting from a digital-to-analog conversion of the amplified, level limited signal, resulting in an amplified analog signal.

7. The system of claim 6, wherein the digital gain is adapted in response to determining that a first rule related to a first temporal condition is satisfied, and wherein the analog gain is adapted in response to determining that a second rule related to a second temporal condition is satisfied.

8. The system of claim 1, wherein the location is in a vehicle comprising a sound generating device that generates the sound based on the output and an input device that receives the input.

9. A method, comprising:
    receiving, by a system comprising a processor and a memory, input information comprising first input audio information and second audio information;
    determining, by the system, a first intermediate signal adapted to remove first environmental noise and a second intermediate signal adapted to remove second environmental noise, wherein the second intermediate signal is adapted based on the first input audio information, and wherein the first intermediate signal is adapted based on the second input audio information;
    separating, by the system, the first intermediate signal into a first channel and a second channel;
    separating, by the system, the second intermediate signal into a third channel and a fourth channel;
    in response to selecting a first gain profile based on comparing sound pressure levels associated with the first gain profile and a second gain profile, wherein the first gain profile is affiliated with a first identity of a first individual in space and wherein the second gain profile is affiliated with a second identity of a second individual in the space, and wherein the first gain profile is ranked higher than the second gain profile based on the first identity and the second identity, modifying the first gain profile relative to the second gain profile, wherein the first gain profile comprises at least a first gain for a first frequency band of an audio signal;

applying, by the system, the first gain of the first gain profile to the first channel resulting in a first amplified channel, a second gain of the first gain profile to the second channel resulting in a second amplified channel, a third gain of the first gain profile to the third channel resulting in a third amplified channel, and a fourth gain of the first gain profile to the fourth channel resulting in a fourth amplified channel; and generating, by the system, output information comprising a first audio output for an individual corresponding to the first identity, based on summing signals related to the first amplified channel and the second amplified channel, and a second audio output based on summing signals related to the third amplified channel and the fourth amplified channel.

10. The method of claim 9, wherein the determining the first intermediate signal is based on the first input audio information and adapted based on the second input audio information, and wherein the determining the second intermediate signal is based on the second input audio information and adapted based on the first input audio information.

11. The method of claim 9, wherein the separating the first intermediate signal comprises separating the first intermediate signal into a first channel associated with a first frequency band and a second channel associated with a second frequency band, and wherein the separating the second intermediate signal comprises separating the second intermediate signal into a third channel associated with a third frequency band and a fourth channel associated with a fourth frequency band.

12. The method of claim 11, wherein the first and third frequency bands are a same frequency band.

13. The method of claim 11, wherein the first and third frequency bands are different but overlapping frequency bands.

14. The method of claim 11, wherein the first and third frequency bands are different and non-overlapping frequency bands.

15. The method of claim 9, wherein the first and second gains are different gains.

16. The method of claim 9, wherein the first and third gains are different gains.

17. The method of claim 9, wherein the generating the output information further comprises:
 level limiting a summation of the first and second amplified channels,
 applying a digital gain to the result of the level limiting,
 converting the result of applying the digital gain to an analog signal, and
 applying an analog gain to the analog signal.

18. A computer readable storage device comprising executable instructions that, in response to execution, cause a system comprising a processor to perform operations, comprising:
 receiving input information comprising input audio information;
 determining an intermediate signal based on the input audio information and an adaptation determined from other input audio information, wherein the intermediate signal comprises less environmental noise than an input audio signal;
 separating the intermediate signal into a first channel associated with a first frequency band and a second channel associated with a second frequency band;
 receiving a gain profile for an identity of an individual, wherein the gain profile comprises at least a first gain for a first frequency band of an audio signal;
 altering the gain profile based on a comparison of the gain profile against other gain profiles for other identities corresponding to other individuals, wherein the individual is determined to be more significant than the other individuals, and wherein the individual is determined to be collocated with the other individuals;
 applying the first gain of the gain profile to the first channel resulting in a first amplified channel;
 applying a second gain of the gain profile to the second channel resulting in a second amplified channel; and
 generating output information comprising audio output information for playback to an individual corresponding to the identity, based on summing signals related to the first amplified channel and the second amplified channel.

19. The computer readable storage device of claim 18, wherein the first frequency band and the second frequency band are different and non-overlapping and the first gain and the second gain are different.

20. The computer readable storage device of claim 18, wherein the generating the output information further comprises:
 level limiting a summation of the first and second amplified channels,
 applying a digital gain to the result of the level limiting,
 converting the result of applying the digital gain to an analog signal, and
 applying an analog gain to the analog signal.

* * * * *